United States Patent
Saito et al.

(10) Patent No.: US 11,693,068 B2
(45) Date of Patent: Jul. 4, 2023

(54) EXCHANGE-COUPLED FILM AND MAGNETORESISTIVE ELEMENT AND MAGNETIC SENSING DEVICE INCLUDING THE SAME

(71) Applicant: Alps Alpine Co., Ltd., Tokyo (JP)

(72) Inventors: Masamichi Saito, Miyagi-ken (JP); Fumihito Koike, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 225 days.

(21) Appl. No.: 17/357,216

(22) Filed: Jun. 24, 2021

(65) Prior Publication Data
US 2021/0382122 A1    Dec. 9, 2021

Related U.S. Application Data

(63) Continuation of application No. PCT/JP2019/048560, filed on Dec. 11, 2019.

(30) Foreign Application Priority Data

Dec. 27, 2018 (JP) ................................ 2018-244446
May 24, 2019 (JP) ................................ 2019-097861
Aug. 26, 2019 (JP) ................................ 2019-153669

(51) Int. Cl.
*G01R 33/09* (2006.01)
*H01F 10/32* (2006.01)

(52) U.S. Cl.
CPC ....... *G01R 33/093* (2013.01); *H01F 10/3268* (2013.01)

(58) Field of Classification Search
CPC .......................... H01F 10/3268; G01R 33/093
See application file for complete search history.

(56) References Cited

U.S. PATENT DOCUMENTS

2015/0340598 A1* 11/2015 Gan ...................... G11C 11/161
                                                              257/421

FOREIGN PATENT DOCUMENTS

| JP | 2000-215431 | 8/2000 |
| JP | 2007-049135 A | 2/2007 |
| JP | 2007-299880 A | 11/2007 |
| JP | 2017-157662 A | 9/2017 |
| WO | WO 2018/029883 A1 | 2/2018 |

OTHER PUBLICATIONS

International Search Report from corresponding international application No. PCT/JP2019/048560, 5pp., dated Feb. 19, 2020.

* cited by examiner

*Primary Examiner* — Alesa Allgood
(74) *Attorney, Agent, or Firm* — Crowell & Moring LLP

(57) ABSTRACT

An exchange-coupled film includes a antiferromagnetic layer and a pinned magnetic layer including a ferromagnetic layer stacked together, the antiferromagnetic layer having a structure including an IrMn layer, a first PtMn layer, a PtCr layer, and a second PtMn layer stacked in that order, the IrMn layer being in contact with the pinned magnetic layer. The second PtMn layer preferably has a thickness of more than 0 Å and less than 60 Å, in some cases. The PtCr layer preferably has a thickness of 100 Å or more, in some cases. The antiferromagnetic layer preferably has a total thickness of 200 Å or less, in some cases.

14 Claims, 25 Drawing Sheets

EXCHANGE-COUPLED FILM AND MAGNETORESISTIVE ELEMENT AND MAGNETIC SENSING DEVICE INCLUDING THE SAME

CLAIM OF PRIORITY

This application is a Continuation of International Application No. PCT/JP2019/048560 filed on Dec. 11, 2019, which claims benefit of priority to Japanese Patent Application No. 2018-244446 filed on Dec. 27, 2018, Japanese Patent Application No. 2019-097861, filed May 24, 2019 and Japanese Patent Application No. 2019-153669, filed Aug. 26, 2019. The entire contents of each application noted above are hereby incorporated by reference.

BACKGROUND

1. Field of the Disclosure

The present disclosure relates to an exchange-coupled film and a magnetoresistive element and a magnetic sensing device including the exchange-coupled film.

2. Description of the Related Art

Exchange-coupled films including an antiferromagnetic layer and a pinned magnetic layer are used as magnetoresistive elements or magnetic sensors. Japanese Unexamined Patent Application Publication No. 2000-215431 states that in a magnetic recording medium, an exchange-coupled film can be configured by combining a Co alloy serving as a ferromagnetic film with various alloys serving as antiferromagnetic films. Alloys such as CoMn, NiMn, PtMn, and PtCr are exemplified are exemplified as anti ferromagnetic films.

A magnetic sensing device needs to be subjected to solder reflow processing (melting processing) when a magnetoresistive element is mounted on a board. The magnetic sensing device is used in a high-temperature environment, such as the vicinity of an engine, in some cases. For an exchange-coupled film used in the magnetic sensing device, a magnetic field (Hex) needed to reverse the magnetization direction of a pinned magnetic layer is preferably high in order to enable the detection of a magnetic field in a wide dynamic range.

Recently, it has been found desirable that the magnetization direction of a pinned magnetic layer be less affected even in an environment where the magnetic sensing device is disposed near a source of a high magnetic field, such as a high-power motor, and where a high magnetic field is applied thereto. That is, strong-magnetic field resistance has been required.

SUMMARY

The present disclosure aims to provide an exchange-coupled film in which a magnetic field (Hex) needed to reverse the magnetization direction of a ferromagnetic layer, such as a pinned magnetic layer, that is exchange-coupled to an antiferromagnetic layer is high and which thus has excellent strong-magnetic field resistance, and a magnetoresistive element and a magnetic sensing device including the exchange-coupled film.

According to one aspect, an exchange-coupled film includes an antiferromagnetic layer and a ferromagnetic layer stacked together, the antiferromagnetic layer having a structure including an IrMn layer, a first PtMn layer, a PtCr layer, and a second PtMn layer stacked in that order, the IrMn layer being close to the ferromagnetic layer. The IrMn layer may be stacked so as to be in contact with the ferromagnetic layer.

In the exchange-coupled film according to an aspect of the present invention, the antiferromagnetic layer has a structure including the IrMn layer, the first PtMn layer, the PtCr layer, and the second PtMn layer stacked together, thereby achieving the enhancement of the exchange coupling field Hex. Thus, the exchange-coupled film having excellent strong-magnetic field resistance is provided. In the exchange-coupled film according to an embodiment of the present invention, a high exchange coupling field Hex can be obtained even at a small thickness of the PtCr layer, compared with the case where the second PtMn layer is not stacked. Thus, the thickness (total thickness) of the entire antiferromagnetic layer can be relatively reduced, which is preferred from the viewpoint of production efficiency and so forth.

Another aspect of the present invention provides an exchange-coupled film including an antiferromagnetic layer and a ferromagnetic layer stacked together, the antiferromagnetic layer having a structure including a first PtMn layer, a PtCr layer, and a second PtMn layer stacked in that order, the first PtMn layer being close to the ferromagnetic layer, the thickness of the PtCr layer being larger than any of the thickness of the first PtMn layer and the thickness of the second PtMn layer. In the exchange-coupled film including the antiferromagnetic layer having the stacked structure, the exchange coupling field Hex is high, and the relationship between the exchange coupling field Hex and the coercive force Hc is prone to be Hex>Hc; thus, the exchange coupling field Hex has satisfactory strong-magnetic field resistance. Additionally, the exchange-coupled film tends to have a high blocking temperature, in some cases.

DESCRIPTION OF THE EXEMPLARY EMBODIMENTS

Figure 1:
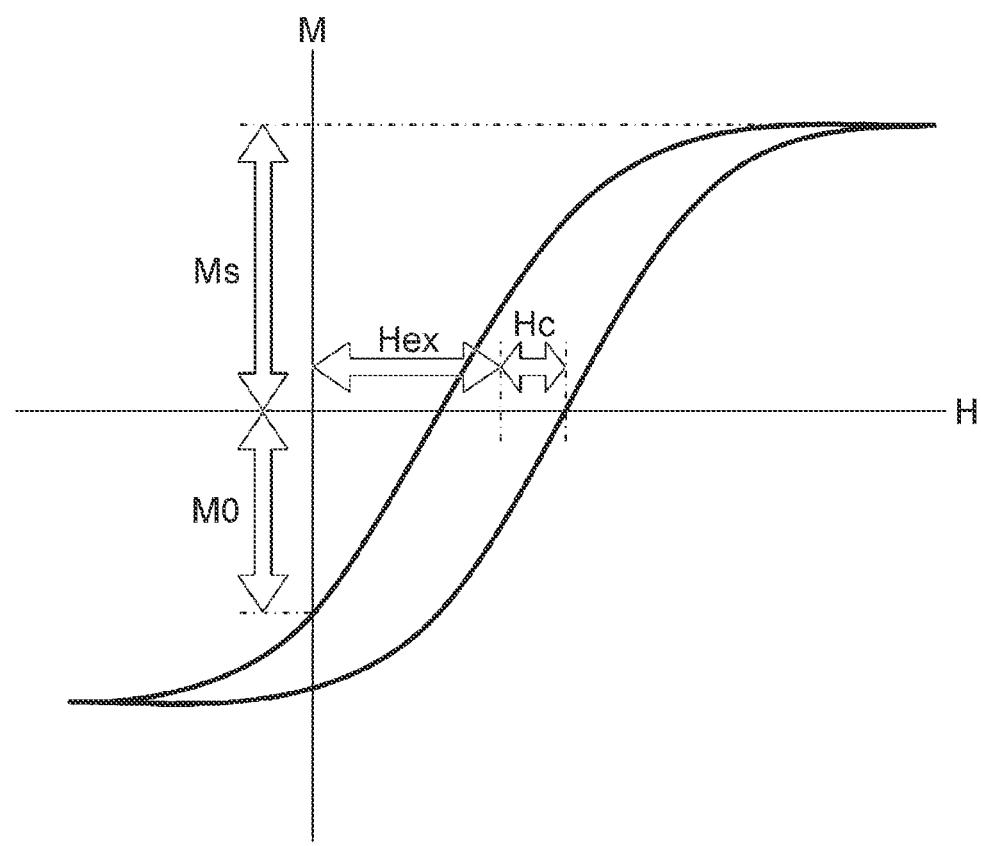
FIG. 1 illustrates a hysteresis loop in the magnetization curve of an exchange-coupled film according to an embodiment of the present invention.

FIG. 1 illustrates a hysteresis loop in the magnetization curve of an exchange-coupled film according to an embodiment of the present invention. Typically, a hysteresis loop formed in the M-H curve (magnetization curve) of a soft magnetic material is symmetric about the intersection of the H axis and the M axis (magnetic field H=0 A/m and magnetization M=0 A/m). As illustrated in FIG. 1, however, in the exchange-coupled film according to an embodiment of the present invention, the hysteresis loop of the exchange-coupled film has a shape shifted along the H axis according to the magnitude of the exchange coupling field Hex because an exchange coupling field Hex acts on a pinned magnetic layer including the ferromagnetic layer that is exchange-coupled to the antiferromagnetic layer. The pinned magnetic layer of the exchange-coupled film having a higher exchange coupling field Hex is less likely to cause reversal of the magnetization direction upon applying an external magnetic field and thus is a better pinned magnetic layer.

The coercive force Hc is defined as the difference between the center of the hysteresis loop shifted along the H axis (the magnetic field intensity at the center corresponds to the exchange coupling field Hex) and the intercept of the hysteresis loop with the H axis. Suppose that the coercive force Hc is smaller than the exchange coupling field Hex. In this case, even when an external magnetic field is applied to magnetize the pinned magnetic layer of the exchange-coupled film in a direction along the external magnetic field, the magnetization direction of the pinned magnetic layer can be aligned by the exchange coupling field Hex relatively stronger than the coercive force Hc upon terminating the application of the external magnetic field. That is, when the relationship between the exchange coupling field Hex and the coercive force Hc is Hex>Hc, the exchange-coupled film has satisfactory strong-magnetic field resistance.

Figure 2:
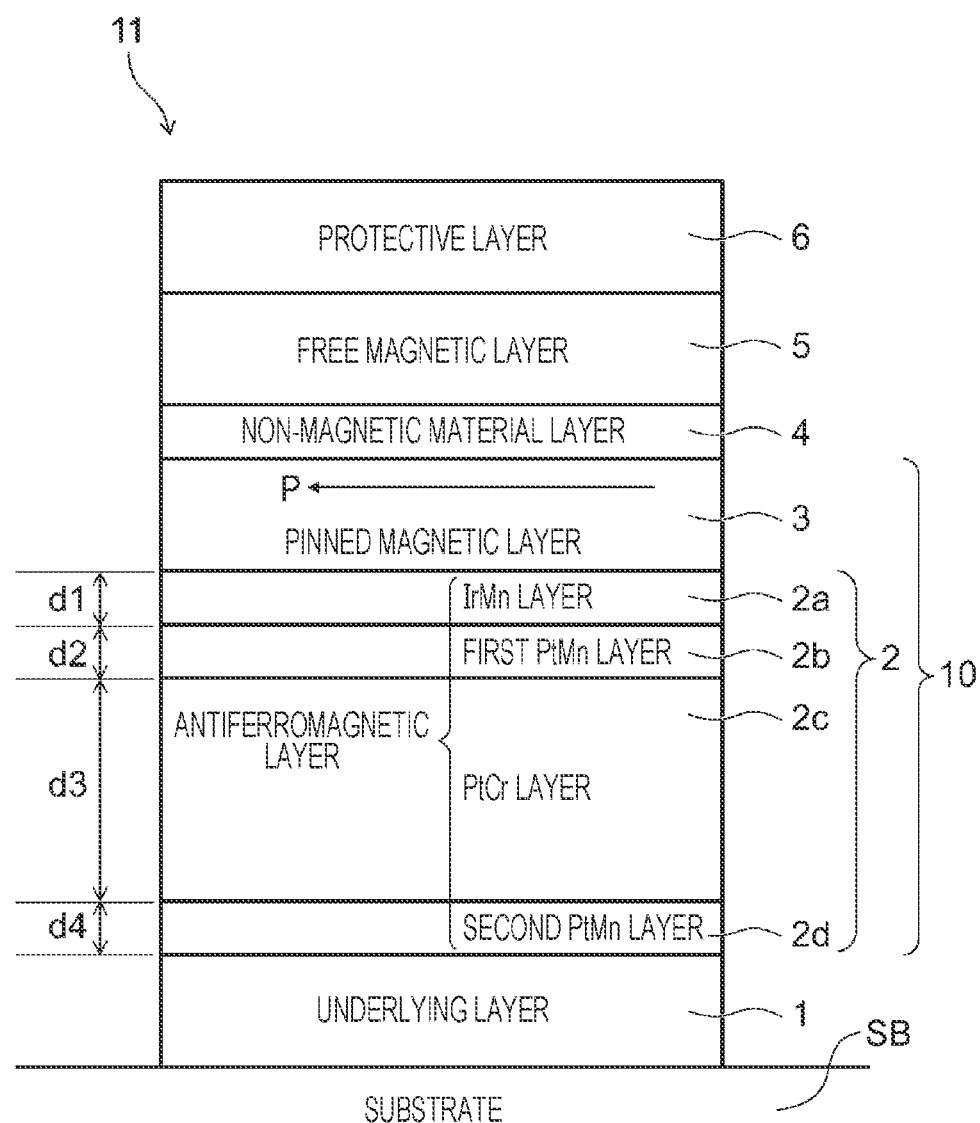
FIG. 2 illustrates the layer structure of an exchange-coupled film according to a first embodiment of the present invention.

FIG. 2 illustrates the layer structure of a magnetic sensing element 11 including an exchange-coupled film 10 according to a first embodiment of the present invention.

The magnetic sensing element 11 includes an underlying layer 1, an antiferromagnetic layer 2, a pinned magnetic layer 3 formed of a ferromagnetic layer, a non-magnetic material layer 4, a free magnetic layer 5, and a protective layer 6 stacked in that order from a surface of a substrate SB (what is called a bottom type). The antiferromagnetic layer 2 has a stacked structure including an IrMn layer 2a, a first PtMn layer 2b, a PtCr layer 2c, and a second PtMn layer 2d stacked in that order, the IrMn layer 2a being close to the ferromagnetic layer (pinned magnetic layer 3). The IrMn layer 2a may be stacked so as to be in contact with the pinned magnetic layer 3. These layers are formed, for example, by a sputtering process or chemical vapor deposition (CVD) process. After the formation, annealing treatment is performed to produce the exchange coupling between the antiferromagnetic layer 2 and the pinned magnetic layer 3. The antiferromagnetic layer 2 and the pinned magnetic layer 3 serve as an exchange-coupled film 10 according to the first embodiment of the present invention.

The magnetic sensing element 11 is a multilayer element using what is called a single spin valve-type giant magnetoresistance effect (GMR effect). The electrical resistance thereof varies according to the relative relationship between the vector of the pinned magnetization of the pinned magnetic layer 3 and the vector of magnetization of the free magnetic layer 5 that varies according to an external magnetic field.

As the substrate SB, for example, a silicon substrate including an alumina layer disposed thereon is used. The FIG. 1 illustrates a hysteresis loop in the magnetization curve of an exchange-coupled film according to an embodiment of the present invention. Typically, a hysteresis loop formed in the M-H curve (magnetization curve) of a soft magnetic material is symmetric about the intersection of the H axis and the M axis (magnetic field H=0 A/m and magnetization M=0 A/m). As illustrated in FIG. 1, however, in the exchange-coupled film according to an embodiment of the present invention, the hysteresis loop of the exchange-coupled film has a shape shifted along the H axis according to the magnitude of the exchange coupling field Hex because an exchange coupling field Hex acts on a pinned magnetic layer including the ferromagnetic layer that is exchange-coupled to the antiferromagnetic layer. The pinned magnetic layer of the exchange-coupled film having a higher exchange coupling field Hex is less likely to cause reversal of the magnetization direction upon applying an external magnetic field and thus is a better pinned magnetic layer.

The coercive force Hc is defined as the difference between the center of the hysteresis loop shifted along the H axis (the magnetic field intensity at the center corresponds to the exchange coupling field Hex) and the intercept of the hysteresis loop with the H axis. Suppose that the coercive force Hc is smaller than the exchange coupling field Hex. In this case, even when an external magnetic field is applied to magnetize the pinned magnetic layer of the exchange-coupled film in a direction along the external magnetic field, the magnetization direction of the pinned magnetic layer can be aligned by the exchange coupling field Hex relatively stronger than the coercive force Hc upon terminating the application of the external magnetic field. That is, when the relationship between the exchange coupling field Hex and the coercive force Hc is Hex>Hc, the exchange-coupled film has satisfactory strong-magnetic field resistance.

Underlying layer 1 is composed of, for example, a NiFeCr alloy (nickel-iron-chromium alloy), Cr, or Ta. In the exchange-coupled film 10 according to the embodiment, the NiFeCr alloy is preferred in order to increase the magnetic field needed to reverse the magnetization direction of the pinned magnetic layer 3 (hereinafter, also appropriately referred to as "Hex").

The antiferromagnetic layer 2 has a structure including the IrMn layer 2a, the first PtMn layer 2b, the PtCr layer 2c, and the second PtMn layer 2d stacked together. This structure results in a strong exchange coupling field Hex and thus allows the ratio (Hex/Hc) of the exchange coupling field Hex to the coercive force Hc to be easily 1 or more. Accordingly, the exchange-coupled film 10 has excellent strong-magnetic field resistance.

The IrMn layer 2a preferably has a thickness of 12 Å or less, more preferably 4 Å or more and 10 Å or less. When the thickness of the IrMn layer 2a is within the range, the exchange coupling field Hex can be enhanced to increase Hex/Hc. Additionally, when the thickness of the IrMn layer 2a is within the range, variations in the thickness of the first PtMn layer 2b less affect the exchange coupling field Hex and Hex/Hc. The second PtMn layer 2d preferably has a thickness of more than 0 Å and less than 60 Å, more preferably 10 Å or more and 50 Å or less, or 15 Å or more and 55 Å or less, particularly preferably 20 Å or more and 50 Å or less. When the thickness of the second PtMn layer 2d is within the range, the exchange coupling field Hex can be enhanced to increase Hex/Hc.

The PtCr layer 2c preferably has a thickness of 100 Å or more, more preferably 110 Å or more. When the PtCr layer 2c has a thickness of 100 Å or more, the exchange coupling field Hex can be enhanced to increase Hex/Hc. The upper limit of the thickness of the PtCr layer 2c is preferably 200 Å or less from the viewpoint of production efficiency, in some cases.

The antiferromagnetic layer 2 preferably has a total thickness of 200 Å or less. Even when the antiferromagnetic layer 2 has a total thickness of 200 Å or less, the exchange coupling field Hex can be enhanced; thus, the production efficiency of the exchange-coupled film 10 can be enhanced.

In this embodiment, the antiferromagnetic layer 2 is ordered by annealing treatment to induce exchange coupling (at the interface) between the antiferromagnetic layer 2 and the pinned magnetic layer 3 formed of a ferromagnetic layer. Owing to the magnetic field (exchange coupling field Hex) based on this exchange coupling, even when an external magnetic field is applied, the magnetization direction of the exchange-coupled film 10 is not easily reversed, thereby improving the strong-magnetic field resistance. During the annealing treatment for inducing the exchange coupling field Hex in the exchange-coupled film 10, atoms (Pt, Cr, Mn, and Ir) contained in the PtCr layer 2c, the first PtMn layer 2b, the IrMn layer 2a, and the second PtMn layer 2d of the antiferromagnetic layer 2 interdiffuse.

The pinned magnetic layer 3 is composed of a ferromagnetic CoFe alloy (cobalt-iron alloy). The CoFe alloy has a higher coercive force at a higher Fe content. The pinned magnetic layer 3 is a layer contributing to a spin-valve giant magnetoresistance effect. A direction in which the pinned magnetization direction P of the pinned magnetic layer 3 extends is the direction of the sensitive axis of the magnetic sensing element 11. From the viewpoint of increase the resistance of the exchange-coupled film 10 to a strong magnetic field, the pinned magnetic layer 3 preferably has a 12 Å or more and 30 Å or less, in some cases.

The non-magnetic material layer 4 can be composed of, for example, Cu (copper).

The material and structure of the free magnetic layer 5 are not limited. Examples of the material that can be used include CoFe alloys (cobalt-iron alloys) and NiFe alloys (nickel-iron alloys). The free magnetic layer 5 can be formed so as to have a single-layer structure, a layered structure, or a synthetic ferrimagnetic structure.

The protective layer 6 can be composed of, for example, Ta (tantalum).

Figure 3:
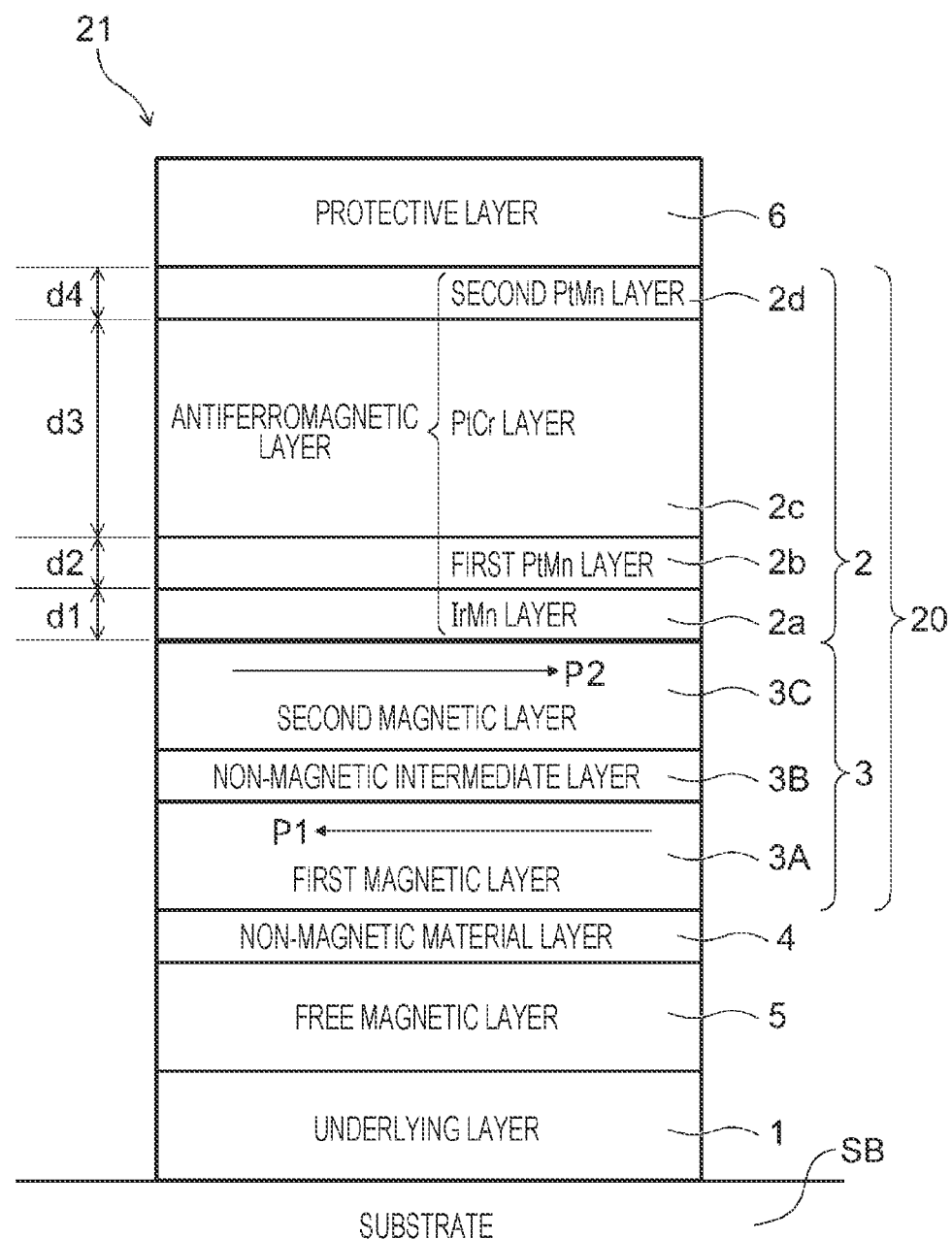
FIG. 3 illustrates the layer structure of an exchange-coupled film according to a second embodiment of the present invention.

FIG. 3 illustrates the layer structure of a magnetic sensing element 21 including an exchange-coupled film 20 according to a second embodiment of the present invention. In this embodiment, the layers having the same functions as those of the magnetic sensing element 11 illustrated in FIG. 2 are designated using the same reference numerals, and redundant description is not repeated.

In the magnetic sensing element 21 according to the second embodiment, the exchange-coupled film 20 includes the pinned magnetic layer 3 having a self-pinned structure and the antiferromagnetic layer 2 joined to each other. The magnetic sensing element 21 differs from the magnetic sensing element 11 illustrated in FIG. 2 in that the non-magnetic material layer 4 and the free magnetic layer 5 are closer to the substrate SB than the pinned magnetic layer 3 (what is called a top type).

The magnetic sensing element 21 is also a multilayer element using what is called a single spin valve-type giant magnetoresistance effect. The electrical resistance thereof varies according to the relative relationship between the vector of a first magnetic layer 3A of the pinned magnetic layer 3 and the vector of magnetization of the free magnetic layer 5 that varies according to an external magnetic field.

The pinned magnetic layer 3 has a self-pinned structure including the first magnetic layer 3A and a second magnetic layer 3C with a non-magnetic intermediate layer 3B provided between these two layers. The pinned magnetization direction P1 of the first magnetic layer 3A is antiparallel to the pinned magnetization direction P2 of the second magnetic layer 3C because of interaction. The pinned magnetization direction P1 of the first magnetic layer 3A adjacent to the non-magnetic material layer 4 is the pinned magnetization direction of the pinned magnetic layer 3. A direction in which the pinned magnetization direction P1 extends is the direction of the sensitive axis of the magnetic sensing element 11.

The first magnetic layer 3A and the second magnetic layer 3C are composed of an FeCo alloy (iron-cobalt alloy). The FeCo alloy has a higher coercive force at a higher Fe content. The first magnetic layer 3A adjacent to the non-magnetic material layer 4 is a layer contributing to a spin-valve giant magnetoresistance effect.

The non-magnetic intermediate layer 3B is composed of, for example, Ru (ruthenium). The non-magnetic intermediate layer 3B composed of Ru preferably has a thickness of 3 to 5 Å or 8 to 10 Å.

In the case where an alloy layer, such as the PtCr layer 2c, is deposited in the production of the exchange-coupled film 20, the multiple types of metals constituting the alloy (Pt and Cr in the case of the PtCr layer 2c) may be simultaneously fed. Alternatively, the multiple types of metals contained in the alloy may be alternately fed. A specific example of the former is simultaneous sputtering of the multiple types of metals constituting the alloy. A specific example of the latter is alternate stacking of different metal films. In some cases, the simultaneous feeding of the multiple types of metals constituting the alloy is more preferable than the alternate feeding in view of achieving a higher Hex, in some cases.

Third Embodiment

Figure 17:
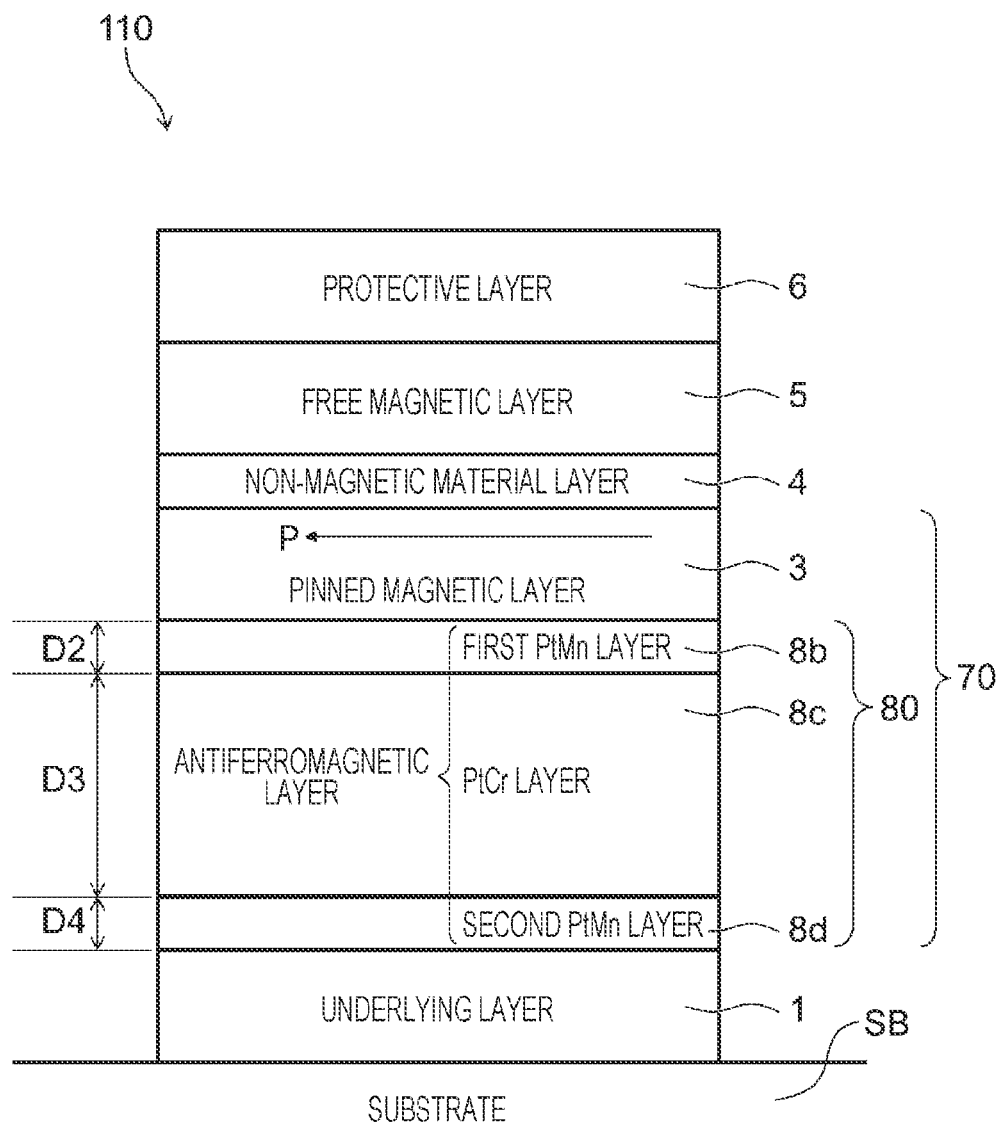
FIG. 17 illustrates the layer structure of an exchange-coupled film according to a third embodiment of the present invention.

FIG. 17 illustrates the layer structure of a magnetic sensing element 110 including an exchange-coupled film 70 according to a third embodiment of the present invention. In this embodiment, the layers having the same functions as those of the magnetic sensing element 11 illustrated in FIG. 2 are designated using the same reference numerals, and redundant description is not repeated.

The magnetic sensing element 110 and the magnetic sensing element 11 illustrated in FIG. 2 have in common is that the non-magnetic material layer 4 and the free magnetic layer 5 are remoter from the substrate SB than the pinned magnetic layer 3 (what is called a bottom type).

An antiferromagnetic layer 80 has a structure including a first PtMn layer 8b, a PtCr layer 8c, and a second PtMn layer 8d stacked together, the thickness D3 of the PtCr layer 8c being larger than any of the thickness D2 of the first PtMn layer 8b and the thickness D4 of the second PtMn layer 8d. This structure results in a particularly strong exchange coupling field Hex and thus allows the ratio (Hex/Hc) of the exchange coupling field Hex to the coercive force Hc to be easily 1 or more. Accordingly, the exchange-coupled film 70 has excellent strong-magnetic field resistance. Additionally, the blocking temperature Tb of the exchange-coupled film 70 according to the third embodiment tends to be higher than the blocking temperature Tb of the exchange-coupled film 10 according to the first embodiment, in some cases.

The second PtMn layer 8d preferably has a thickness D4 of more than 0 Å and less than 60 Å, more preferably 10 Å or more and 50 Å or less or 15 Å or more and 55 Å or less, particularly preferably 20 Å or more and 50 Å or less. When the thickness D4 of the second PtMn layer 8d is within the range, the exchange coupling field Hex can be enhanced to increase Hex/Hc. The ratio of the thickness D3 of the PtCr layer 8c to the thickness D2 of the first PtMn layer 8b is preferably about 2 to about 10 times from the viewpoints of enhancing the exchange coupling field Hex and increasing Hex/Hc, in some cases. The ratio of the thickness D3 of the PtCr layer 8c to the thickness D4 of the second PtMn layer 8d is preferably about 2 to about 10 times from the viewpoints of enhancing the exchange coupling field Hex and increasing Hex/Hc, in some cases.

The PtCr layer 8c preferably has a thickness of 100 Å or more, more preferably 110 Å or more. When the PtCr layer 8c has a thickness of 100 Å or more, the exchange coupling field Hex can be enhanced to increase Hex/Hc. The upper limit of the thickness of the PtCr layer 8c is preferably 200 Å or less from the viewpoint of production efficiency, in some cases.

The antiferromagnetic layer 8 preferably has a total thickness of 200 Å or less. Even when the antiferromagnetic layer 8 has a total thickness of 200 Å or less, the exchange coupling field Hex can be enhanced; thus, the production efficiency of the exchange-coupled film 70 can be enhanced.

In this embodiment, the antiferromagnetic layer 80 is ordered by annealing treatment to induce exchange coupling (at the interface) between the antiferromagnetic layer 80 and the pinned magnetic layer 3 formed of a ferromagnetic layer. Owing to the magnetic field (exchange coupling field Hex) based on this exchange coupling, even when an external magnetic field is applied, the magnetization direction of the exchange-coupled film 70 is not easily reversed, thereby improving the strong-magnetic field resistance. During the annealing treatment for inducing the exchange coupling field Hex in the exchange-coupled film 70, atoms (Pt, Cr, Mn, and Ir) contained in the layers (the first PtMn layer 8b, the PtCr layer 8c, and the second PtMn layer 8d) included in the antiferromagnetic layer 80 interdiffuse.

Figure 18:
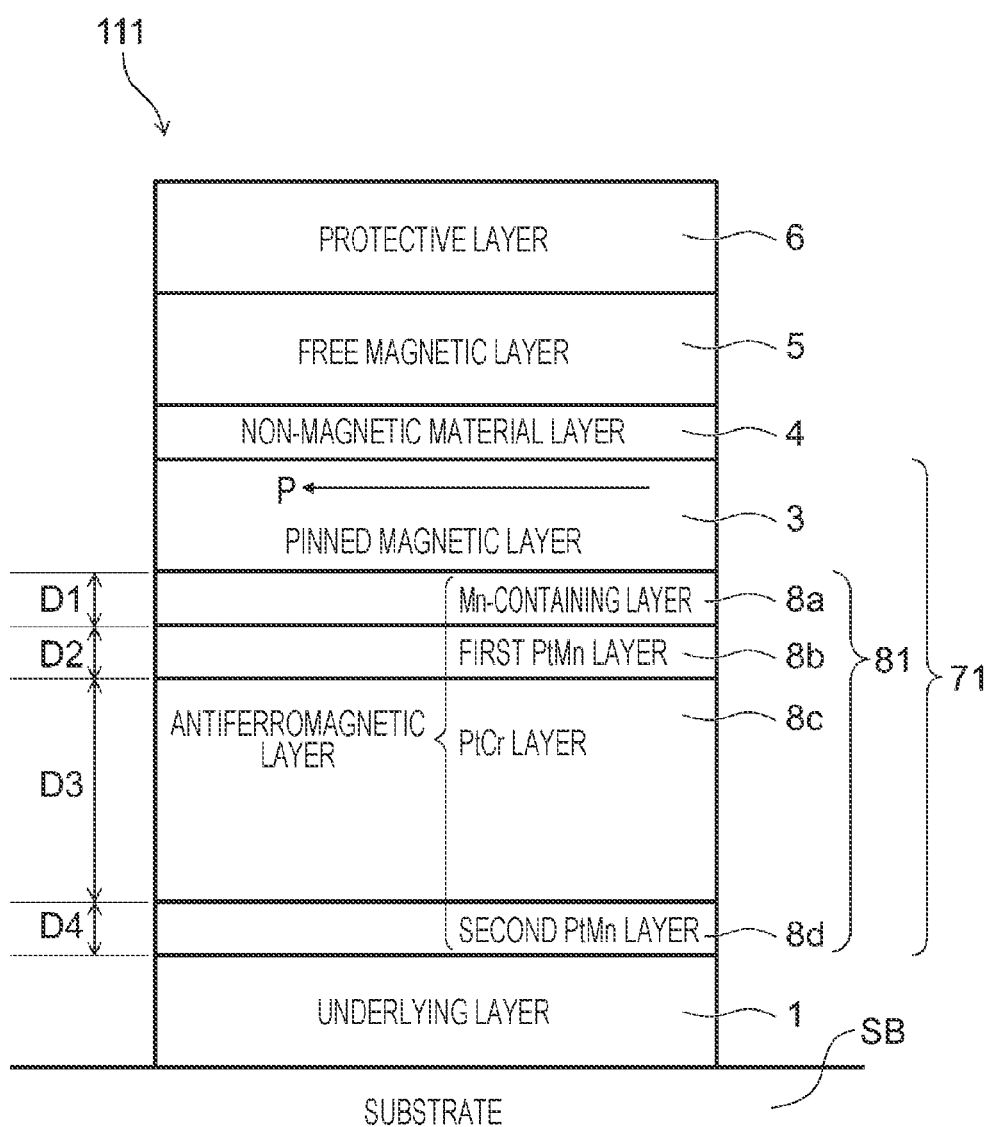
FIG. 18 illustrates the layer structure of an exchange-coupled film according to a modification of the third embodiment of the present invention.

As illustrated in FIG. 18, an exchange-coupled film 71 according to a modification of this embodiment may include a Mn-containing layer 8a having a Mn content of more than 50 at % between the first PtMn layer 8b and the pinned magnetic layer 3. The Mn-containing layer 8a may include multiple layers stacked. The Mn-containing layer 8a may include at least one layer selected from the group consisting of an IrMn layer and a Mn layer. In the case where the Mn-containing layer 8a is formed of an IrMn layer or a stack of an IrMn layer and a PtMn layer, the exchange-coupled film has the same structure as the above-mentioned exchange-coupled film 10 according to the first embodiment of the present invention. The Mn-containing layer 8a preferably has a thickness of 12 Å or less, more preferably 4 Å or more and 10 Å or less. When the thickness of the Mn-containing layer 8a is within the range, the exchange coupling field Hex can be enhanced to increase Hex/Hc. Additionally, when the thickness of the Mn-containing layer 8a is within the range, variations in the thickness of the first PtMn layer 8b less affect the exchange coupling field Hex and Hex/Hc.

Figure 19:
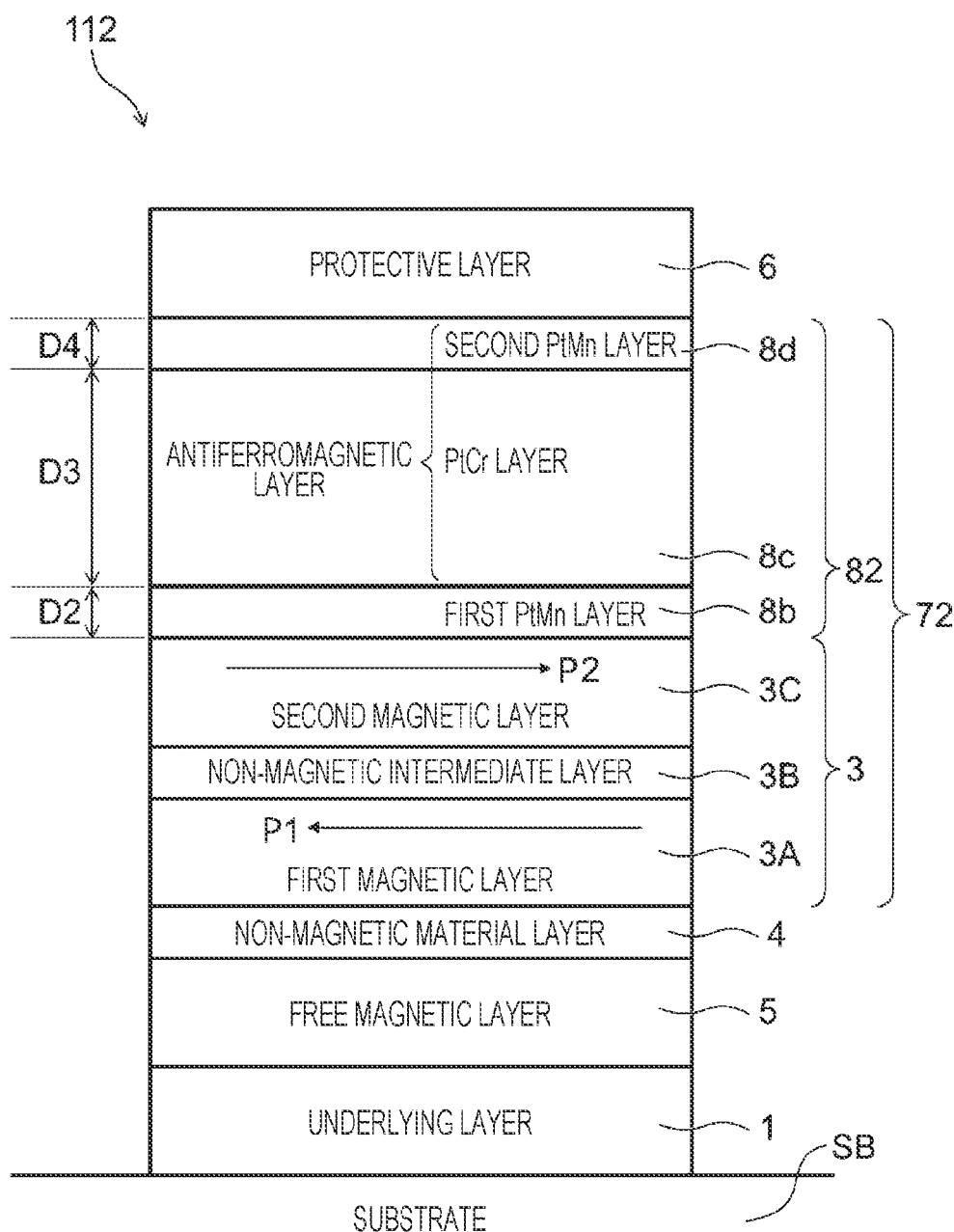
FIG. 19 illustrates the layer structure of an exchange-coupled film according to another modification of the third embodiment of the present invention.
Figure 20:
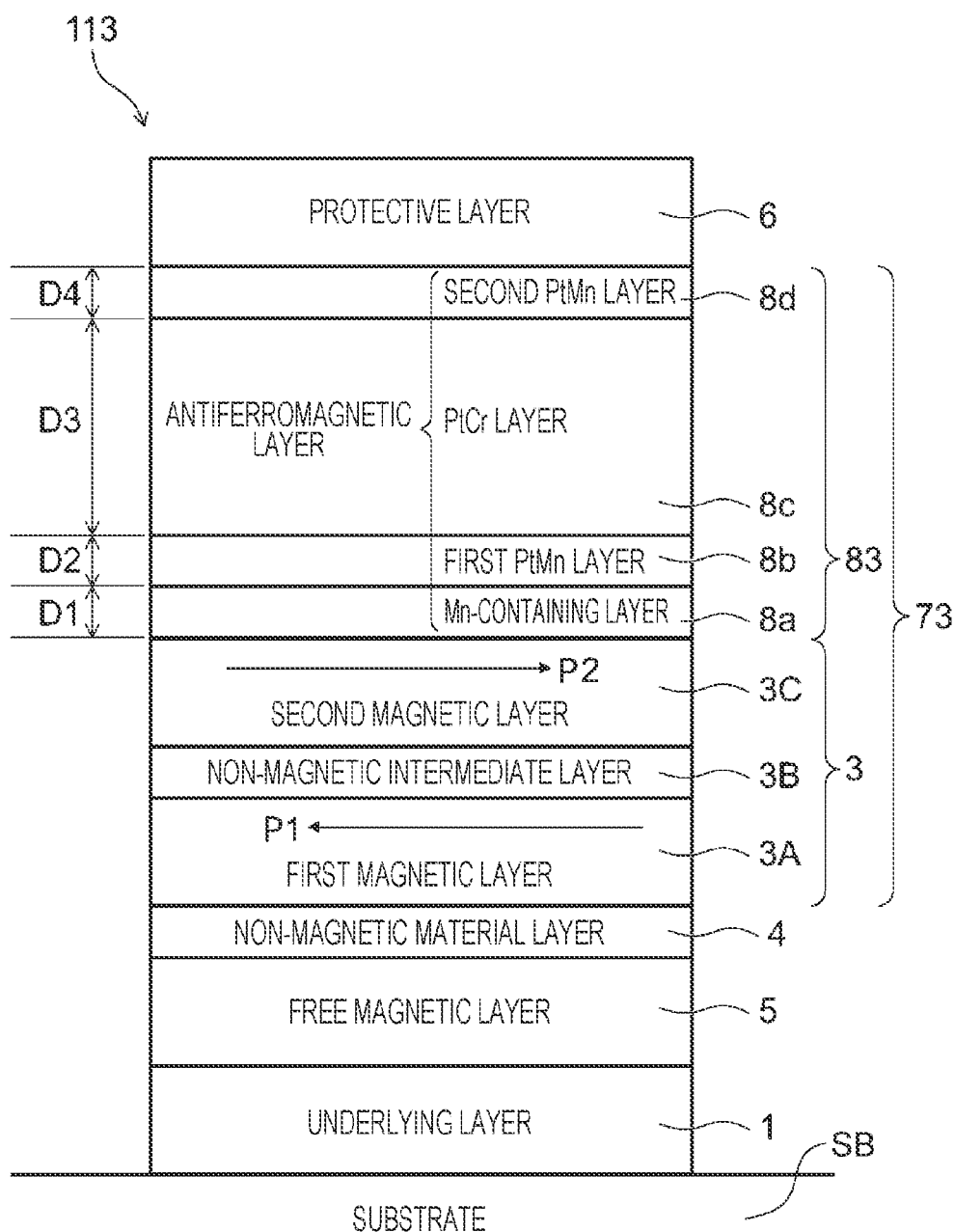
FIG. 20 illustrates the layer structure of an exchange-coupled film according to still another modification of the third embodiment of the present invention.

FIGS. 19 and 20 illustrate the layer structures of magnetic sensing elements 112 and 113 having top-type structures and including exchange-coupled films 72 and 73 that have structures similar to the exchange-coupled films 70 and 71 according to the third embodiment and that include the pinned magnetic layer 3 having a self-pinned structure, corresponding to the relationship between the exchange-coupled film 10 according to the first embodiment and the exchange-coupled film 20 according to the second embodiment.

Configuration of Magnetic Sensor

Figure 4:
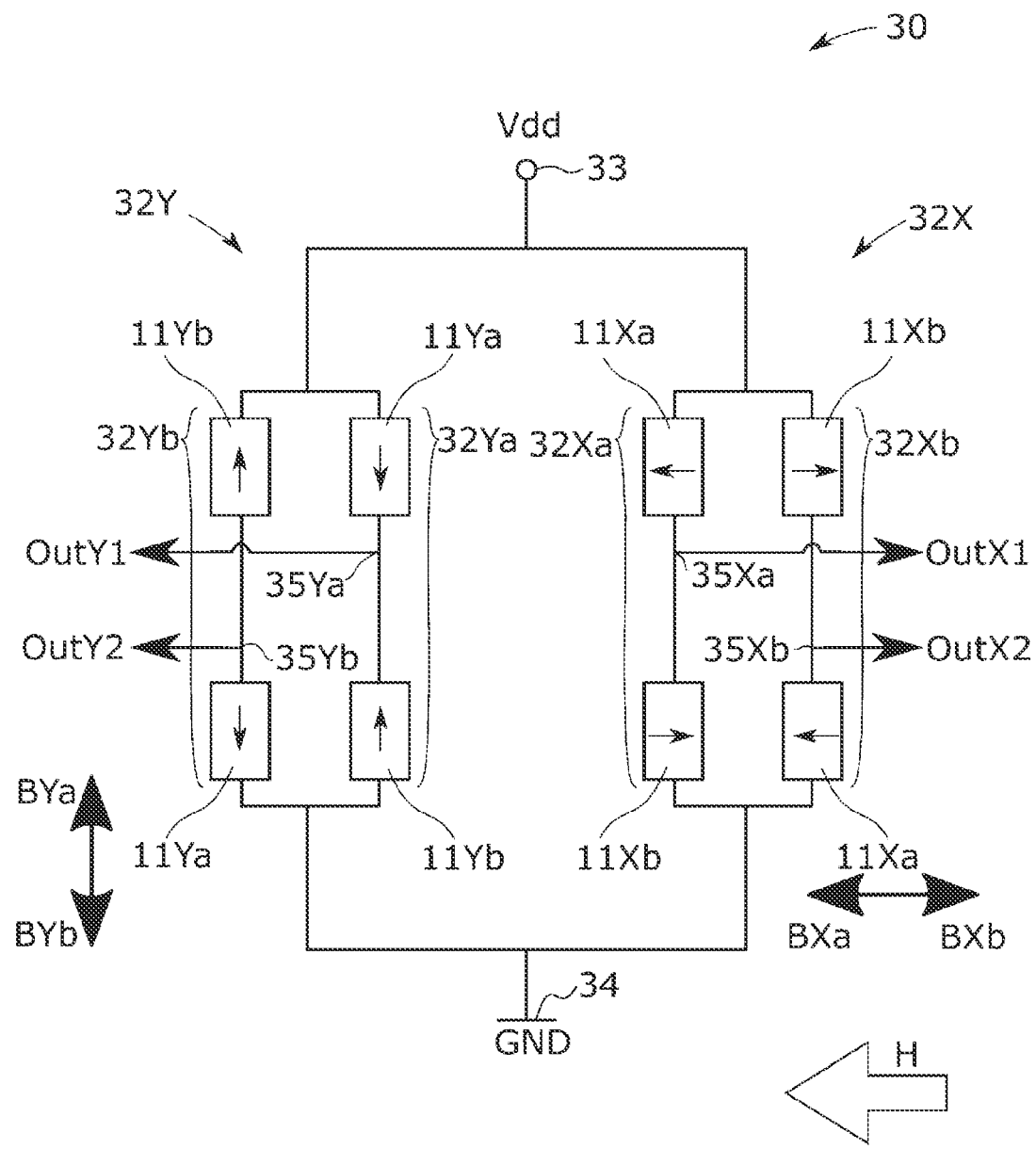
FIG. 4 is a circuit block diagram of a magnetic sensor according to an embodiment of the present invention.

FIG. 4 illustrates a magnetic sensor (magnetic sensing device) 30 in which the magnetic sensing elements 11 illustrated in FIG. 2 are combined. In FIG. 4, the magnetic sensing elements 11 having different pinned magnetization directions P (see FIG. 2) are designated using different reference numerals, i.e., 11Xa, 11Xb, 11Ya, and 11Yb, and thus distinguished. In the magnetic sensor 30, the magnetic sensing elements 11Xa, 11Xb, 11Ya, and 11Yb are disposed on the same substrate.

The magnetic sensor 30 illustrated in FIG. 4 includes a full-bridge circuit 32X and a full-bridge circuit 32Y. The full-bridge circuit 32X includes two magnetic sensing elements 11Xa and two magnetic sensing elements 11Xb. The full-bridge circuit 32Y includes two magnetic sensing elements 11Ya and two magnetic sensing elements 11Yb. Each of the magnetic sensing elements 11Xa, 11Xb, 11Ya, and 11Yb has the layer structure of the exchange-coupled film 10 of the magnetic sensing element 11 illustrated in FIG. 4. When these are not particularly distinguished, hereinafter, these will be referred to as the "magnetic sensing element 11", as appropriate.

The full-bridge circuits 32X and 32Y include the magnetic sensing elements 11 having different pinned magnetization directions indicated by arrows in FIG. 4 in order to detect different magnetization directions and have the same mechanism for detecting a magnetic field. Accordingly, the mechanism for detecting a magnetic field using the full-bridge circuit 32X will be described below.

The full-bridge circuit 32X includes a first series section 32Xa and a second series section 32Xb connected in parallel. The first series section 32Xa includes the magnetic sensing element 11Xa and the magnetic sensing element 11Xb connected in series. The second series section 32Xb includes the magnetic sensing element 11Xb and the magnetic sensing element 11Xa connected in series.

A power supply voltage Vdd is applied to a power supply terminal 33 common to the magnetic sensing element 11Xa included in the first series section 32Xa and the magnetic sensing element 11Xb included in the second series section 32Xb. A ground terminal 34 common to the magnetic sensing element 11Xb included in the first series section 32Xa and the magnetic sensing element 11Xa included in the second series section 32Xb is set to the ground potential GND.

In the full-bridge circuit 32X, the differential output (OutX1)−(OutX2) between the output potential (OutX1) at the midpoint 35Xa of the first series section 32Xa and the output potential (OutX2) at the midpoint 35Xb of the second series section 32Xb is obtained as a detection output (detection output voltage) VXs in the X direction.

The full-bridge circuit 32Y works similarly to the full-bridge circuit 32X; thus, the differential output (OutY1)−(OutY2) between the output potential (OutY1) at the midpoint 35Ya of a first series section 32Ya and the output potential (OutY2) at the midpoint 35Yb of a second series section 32Yb is obtained as a detection output (detection output voltage) VYs in the Y direction.

As indicated by the arrows in FIG. 4, the direction of the sensitive axis of each of the magnetic sensing elements 11Xa and 11Xb included in the full-bridge circuit 32X is perpendicular to the direction of the sensitive axis of each of the magnetic sensing elements 11Ya and 11Yb included in the full-bridge circuit 32Y.

In the magnetic sensor 30 illustrated in FIG. 4, the orientation of the free magnetic layer 5 of each magnetic sensing element 11 changes so as to follow the direction of an external magnetic field H. On this occasion, the resistance varies on the basis of the vector relationship between the pinned magnetization direction P of the pinned magnetic layer 3 and the magnetization direction of the free magnetic layer 5.

For example, when the external magnetic field H acts in the direction illustrated in FIG. 4, the electrical resistance of the magnetic sensing element 11Xa included in the full-bridge circuit 32X decreases because the direction of the sensitive axis conforms to the direction of the external magnetic field H. In contrast, the electrical resistance of the magnetic sensing element 11Xb increases because the direction of the sensitive axis is opposite the direction of the external magnetic field H. The change in electric resistance maximizes the detection output voltage VXs=(OutX1)−(OutX2). The detection output voltage VXs decreases as the external magnetic field H changes rightward with respect to the paper plane. When the external magnetic field H is directed upward or downward with respect to the paper plane of FIG. 3, the detection output voltage VXs is zero.

In the full-bridge circuit 32Y, when the external magnetic field H is leftward with respect to the paper plane as illustrated in FIG. 4, the magnetization direction of the free magnetic layer 5 of each magnetic sensing element 11 is perpendicular to the direction of the sensitive axis (pinned magnetization direction P); thus, the magnetic sensing elements 11Ya and 11Xb have identical electrical resistance. Accordingly, the detection output voltage VYs is zero. When the external magnetic field H acts downward with respect to the paper plane in FIG. 4, the detection output voltage VYs=(OutY1)−(OutY2) of the full-bridge circuit 32Y is maximized. The detection output voltage VYs decreases as the direction of the external magnetic field H changes upward with respect to the paper plane.

As described above, when the direction of the external magnetic field H changes, the detection output voltages VXs and VYs of the full-bridge circuits 32X and 32Y vary. Accordingly, the movement direction and travel distance (relative position) of a detection target can be detected on the basis of the detection output voltages VXs and VYs obtained from the full-bridge circuits 32X and 32Y.

FIG. 4 illustrates the magnetic sensor 30 configured to be capable of detecting a magnetic field in the X direction and the Y direction perpendicular to the X direction. However, the magnetic sensor 30 may include only the full-bridge circuit 32X or full-bridge circuit 32Y that detects a magnetic field in the X direction or Y direction only.

Figure 5:
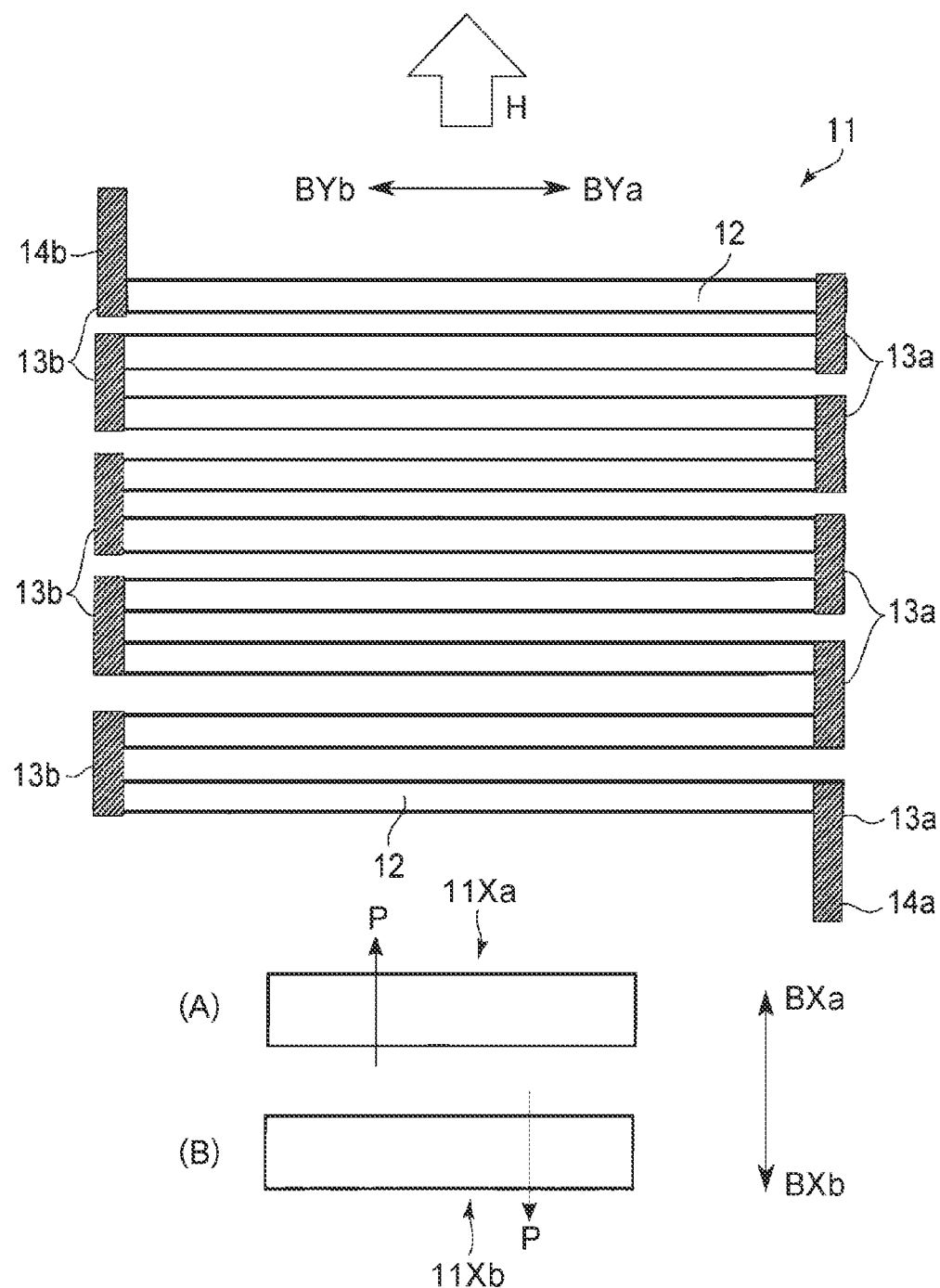
FIG. 5 is a plan view illustrating a magnetic sensing element used for the magnetic sensor.

FIG. 5 illustrates the planar structure of each of the magnetic sensing elements 11Xa and 11Xb. In FIGS. 4 and 5, the BXa-BXb is the X direction. In (A) and (B) of FIG. 5, the pinned magnetization directions P of the magnetic detection elements 11Xa and 11Xb are indicated by arrows. The pinned magnetization directions P of the magnetic sensing elements 11Xa and 11Xb are the X direction and opposite each other.

As illustrated in FIG. 5, the magnetic sensing elements 11Xa and 11Xb each include stripe-shaped element sections 12. The longitudinal direction of each element section 12 is directed in the BYa-BYb direction. The multiple element sections 12 are arranged in parallel to each other. The right end portions of adjacent element sections 12 in the figure are connected to each other with conductive portions 13a. The left end portions of adjacent element sections 12 in the figure are connected to each other with conductive portions 13b. The conductive portions 13a and 13b are alternately connected to the right and left end portions of the element sections 12. The element sections 12 are coupled to each other in what is called a meander shape. In the magnetic sensing elements 11Xa and 11Xb, the conductive portion 13a illustrated in the lower right portion in the figure is united with a connection terminal 14a. The conductive portion 13b illustrated in the upper left portion in the figure is united with a connection terminal 14b.

Each of the element sections 12 is formed of multiple metal layers (alloy layers) stacked. FIG. 2 illustrates the multilayer structure of the element section 12. The element section 12 may have a multilayer structure illustrated in FIG. 3.

In the magnetic sensor 30 illustrated in FIGS. 4 and 5, the magnetic sensing element 11 can be replaced with the magnetic sensing element 21 according to the second embodiment illustrated in FIG. 3.

The embodiments heretofore explained are described to facilitate understanding of the present invention and are not described to limit the present invention. It is therefore intended that the elements disclosed in the above embodiments include all design changes and equivalents to fall within the technical scope of the present invention. For example, in the above-mentioned exchange-coupled film, the IrMn layer 2a is in contact with the pinned magnetic layer 3, in other words, the IrMn layer 2a is directly stacked on the pinned magnetic layer 3 stacked. Another layer containing Mn (examples thereof include a Mn layer and a PtMn layer) may be stacked between the IrMn layer 2a and the pinned magnetic layer 3. Additionally, in the exchange-coupled film according to an embodiment of the present invention, the ferromagnetic layer in contact with the antiferromagnetic layer is not limited to the pinned magnetic layer. For example, the exchange-coupled film according to an embodiment of the present invention may include an antiferromagnetic layer and a ferromagnetic layer included in at least part of a free magnetic layer. In the above description, the giant magnetoresistive effect (GMR) element is exemplified as the magnetic sensing element including the exchange-coupled film according to an embodiment of the present invention. However, the magnetic sensing element including the exchange-coupled film according to an embodiment of the present invention may be a tunnel magnetoresistive effect (TMR) element.

EXAMPLES

Hereinafter, the present invention will be described further specifically with reference to examples and the like, but the scope of the present invention is not limited to these examples and the like.

Examples 1 to 7 and Comparative Examples 1 to 10-2

Figure 6:
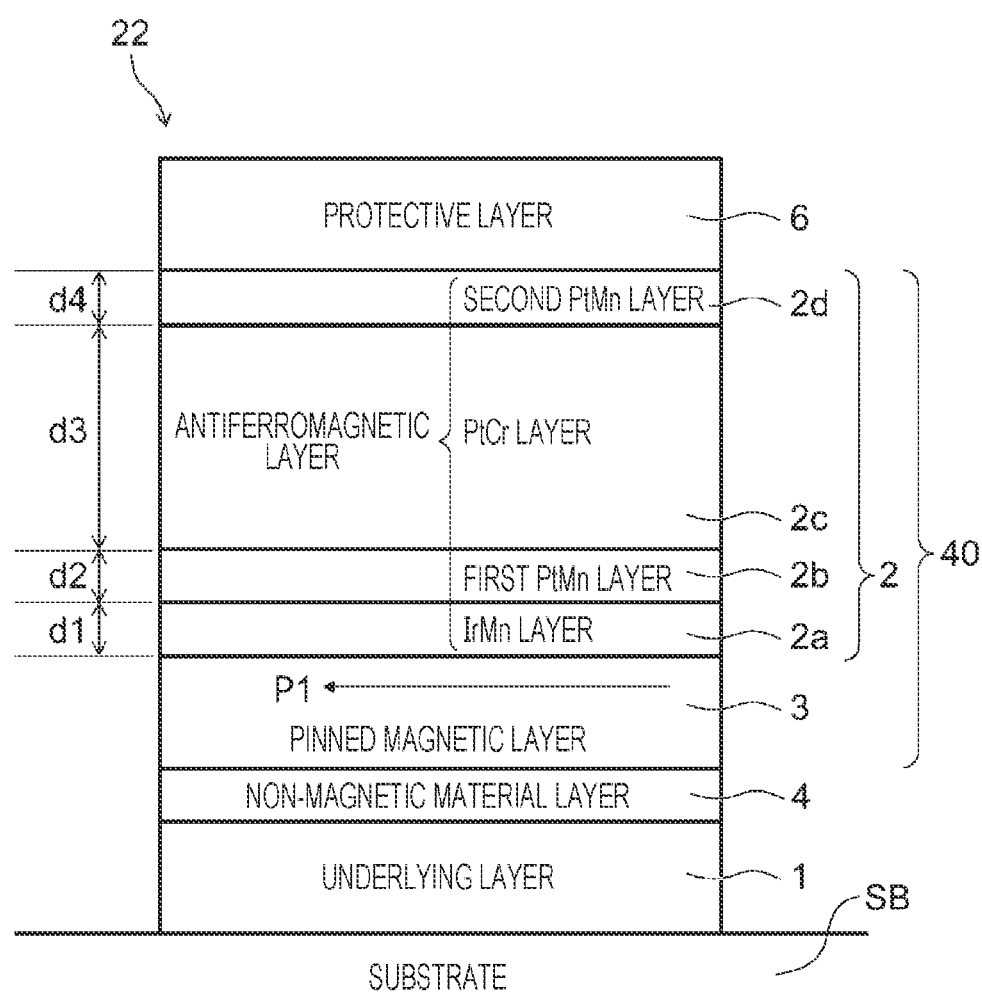
FIG. 6 illustrates the layer structure of a multilayer stack according to Example 1.

Multilayer stacks 22 having a layer structure described below (see FIG. 6) were produced for the purpose of evaluating the characteristics of exchange-coupled films 40. In the following examples and comparative examples, values given in parentheses represent the thickness (Å). Each of the multilayer stacks 22 was subjected to annealing treatment at 350° C. for 20 hours in a magnetic field of 15 kOe to pin the magnetization of the pinned magnetic layer 3 formed of a ferromagnetic layer and the antiferromagnetic layer 2, thereby producing the multilayer stack 22 including the exchange-coupled film 40.

Substrate SB: silicon substrate including alumina layer formed on surface/underlying layer 1: NiFeCr (42)/nonmagnetic material layer 4: [Cu (30)/Ru (20)]/pinned magnetic layer 3: $Co_{40at\%}Fe_{60at\%}$ (18.5)/antiferromagnetic layer 2 [IrMn layer 2a: $Ir_{22at\%}Mn_{78at\%}$ (d1)/first PtMn layer 2b: $Pt_{50at\%}Mn_{50at\%}$ (d2)/PtCr layer 2c: $Pt_{51at\%}Cr_{49at\%}$ (d3)/second PtMn layer 2d: $Pt_{50at\%}Mn_{50at\%}$ (d4)]/protective layer 6: Ta (100)

The IrMn layers 2a had different thicknesses d1 ranging from 0 Å to 8 Å. The first PtMn layers 2b had different thicknesses d2 ranging from 0 Å to 300 Å. The PtCr layers 2c had different thicknesses d3 ranging from 0 Å to 300 Å. The second PtMn layers 2d had different thicknesses D1 ranging from 0 Å to 180 Å. Tables 1 and 2 present d1 to d4 and the thickness (total thickness) of the entire antiferromagnetic layer 2 in each of the examples and comparative examples.

TABLE 1

| | Thickness of antiferromagnetic layer (Å) | | | | | Hc (Oe) | Hex (Oe) | Hex/Hc |
|---|---|---|---|---|---|---|---|---|
| | d1 | d2 | d3 | d4 | thickness | | | |
| Comparative example 1 | 0 | 300 | 0 | 0 | 300 | 965 | 812 | 0.84 |
| Comparative example 2 | 0 | 0 | 0 | 180 | 180 | 1008 | 700 | 0.69 |
| Comparative example 3 | 0 | 0 | 300 | 0 | 300 | 529 | 341 | 0.64 |
| Comparative example 4 | 8 | 12 | 300 | | 320 | 800 | 848 | 1.06 |
| Comparative example 5 | | 240 | | | 260 | 812 | 879 | 1.08 |
| Comparative example 6 | | 200 | | | 220 | 825 | 901 | 1.09 |
| Comparative example 7 | | 160 | | | 180 | 683 | 590 | 0.86 |
| Comparative example 8 | | 120 | | | 140 | 476 | 50 | 0.10 |
| Example 1 | 8 | 12 | 120 | 40 | 180 | 892 | 1102 | 1.24 |

TABLE 2

| | Thickness of antiferromagnetic layer (Å) | | | | | | |
|---|---|---|---|---|---|---|---|
| | d1 | d2 | d3 | d4 | Total thickness | Hc (Oe) | Hex (Oe) | Hex/Hc |
| Comparative example 7 | 8 | 12 | 160 | 0 | 180 | 683 | 590 | 0.86 |
| Example 7 | | | 150 | 10 | | 685 | 615 | 0.90 |
| Example 2 | | | 140 | 20 | | 798 | 913 | 1.14 |
| Example 3 | | | 130 | 30 | | 872 | 1238 | 1.42 |
| Example 1 | | | 120 | 40 | | 892 | 1102 | 1.24 |
| Example 4 | | | 100 | 60 | | 889 | 685 | 0.77 |
| Example 5 | | | 80 | 80 | | 840 | 608 | 0.72 |
| Example 6 | | | 40 | 120 | | 871 | 657 | 0.75 |
| Comparative example 10-1 | | | 10 | 150 | | 920 | 470 | 0.51 |
| Comparative example 10-2 | | | 5 | 155 | | 900 | 460 | 0.51 |
| Comparative example 9 | | | 0 | 160 | | 835 | 495 | 0.59 |

Magnetization curves of the exchange-coupled films 40 according to the examples and the comparative examples were measured with a vibrating sample magnetometer (VSM). The exchange coupling fields Hex (unit: Oe), the coercive forces Hc (unit: Oe), and the ratios (Hex/Hc) of the exchange coupling fields Hex to the coercive forces Hc were determined from the resulting hysteresis loops. Tables 1 and 2 present the results.

Figure 7:
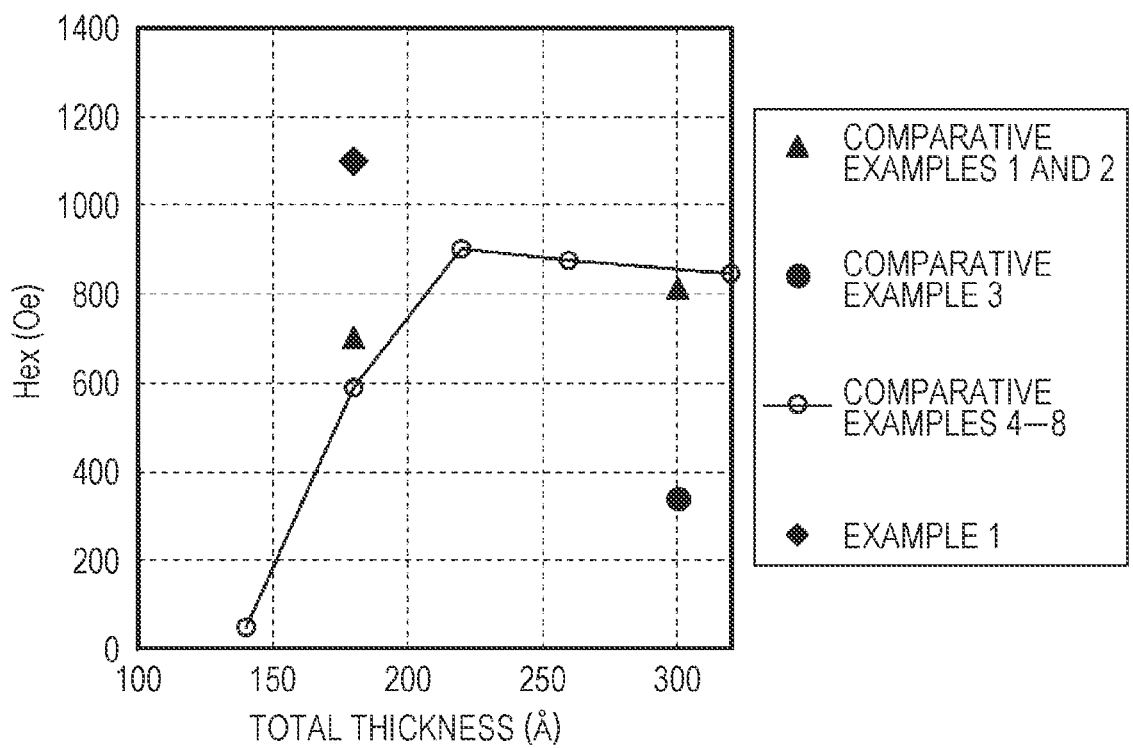
FIG. 7 is a graph illustrating the dependence of an exchange coupling field Hex on the thickness (total thickness) of an antiferromagnetic layer.
Figure 8:
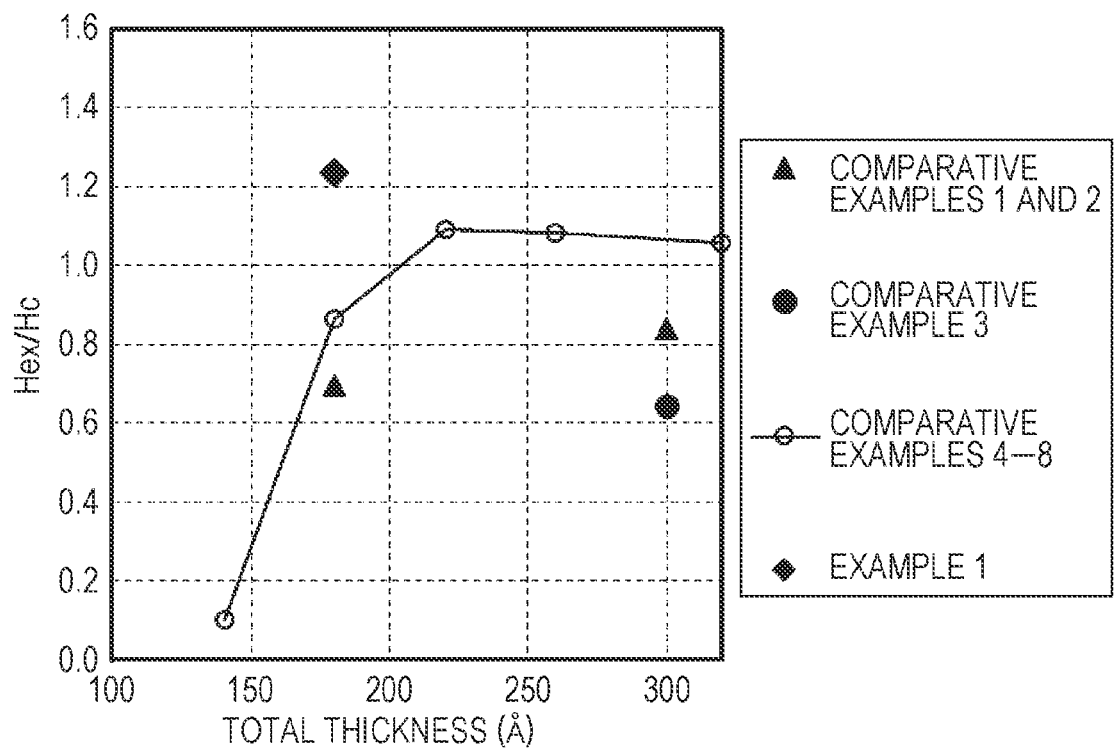
FIG. 8 is a graph illustrating the dependence of the ratio (Hex/Hc) of the exchange coupling field Hex to a coercive force Hc on the thickness (total thickness) of the antiferromagnetic layer.

FIG. 7 is based on the results presented in Table 1 and is a graph illustrating the dependence of the exchange coupling field Hex on the thickness (total thickness) of the antiferromagnetic layer 2. FIG. 8 is based on the results presented in Table 1 and is a graph illustrating the dependence of the ratio (Hex/Hc) of the exchange coupling field Hex to the coercive force Hc on the thickness (total thickness) of the antiferromagnetic layer 2. As is clear from Table 1 and FIGS. 7 and 8, in the exchange-coupled film 40 including the antiferromagnetic layer 2 having the structure according to Example 1, the exchange coupling field Hex was as high as 1,000 Oe or more even at a total thickness of 200 Å or less, and Hex/Hc was more than 1. Accordingly, a magnetic sensing element (for example, a magnetoresistive element) including the exchange-coupled film according to Example 1 can exhibit excellent magnetic properties even in a high-temperature environment or strong magnetic field environment.

In contrast, in the case of the antiferromagnetic layer formed of the PtMn layer (Comparative examples 1 and 2) or the PtCr layer (Comparative example 3), the exchange coupling field Hex was relatively low as compared with the coercive force Hc, and Hex/Hc was less than 1.

In the case where the IrMn layer 2a, the first PtMn layer 2b, and the PtCr layer 2c were stacked and where the second PtMn layer 2d was not deposited (Comparative examples 4 to 8), a smaller thickness of the PtCr layer 2c tended to result in a lower exchange coupling field Hex, and Hex/Hc was about 1.0 or less.

Figure 9:
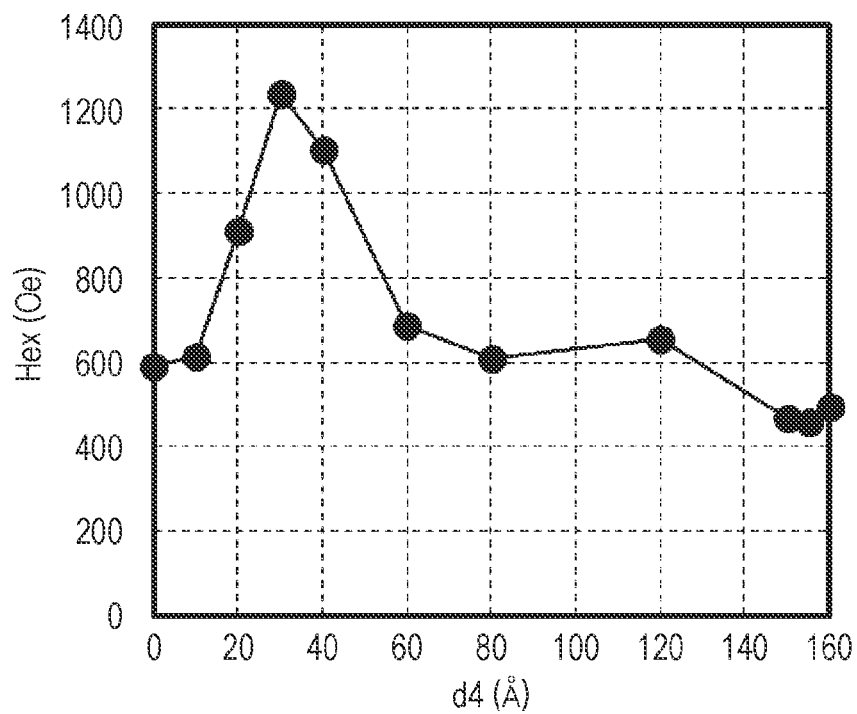
FIG. 9 is a graph illustrating the dependence of the exchange coupling field Hex on the thickness of a second PtMn layer.
Figure 10:
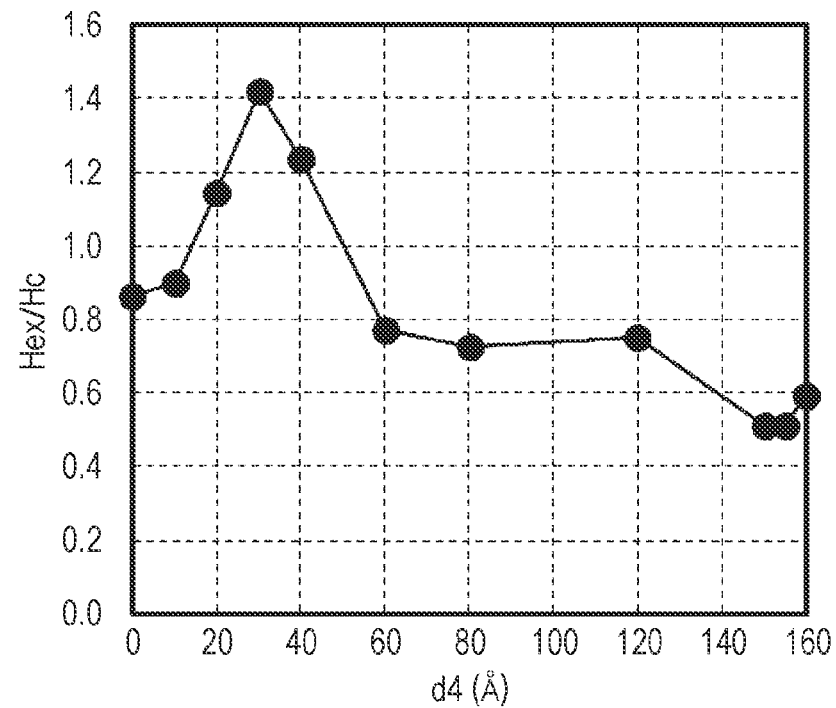
FIG. 10 is a graph illustrating the dependence of the ratio (Hex/Hc) of the exchange coupling field Hex to the coercive force Hc on the thickness of a second PtMn layer.

FIG. 9 is based on the results presented in Table 2 and is a graph illustrating the dependence of the exchange coupling field Hex on the thickness d4 of the second PtMn layer 2d. FIG. 10 is based on the results presented in Table 2 and is a graph illustrating the dependence of the ratio (Hex/Hc) of the exchange coupling field Hex to the coercive force Hc on the thickness d4 of the second PtMn layer 2d. Table 2 and FIGS. 9 and 10 clearly indicated that in the case where the second PtMn layer 2d had a thickness d4 of more than 0 Å and less than 60 Å, in the case where the second PtMn layer 2d preferably had a thickness d4 of more than 10 Å and less than 60 Å, in the case where the second PtMn layer 2d more preferably had a thickness d4 of 15 Å or more and 55 Å or less, or in the case where the second PtMn layer 2d particularly preferably had a thickness d4 of 20 Å or more and 50 Å or less (Examples 1 to 3), the exchange coupling field Hex and Hex/Hc were markedly increased, compared with the case where the first PtMn layer 2b and the PtCr layer 2c were stacked and where the second PtMn layer 2d were not deposited (Comparative example 7). At a thickness d4 of the second PtMn layer 2d of 60 Å or more (Examples 4 to 6), the results indicated that the exchange coupling field Hex was increased, compared with the case where the antiferromagnetic layer 2 had an identical thickness (total thickness) but had no second PtMn layer 2d (Comparative example 7) or the case where the antiferromagnetic layer 2 had an identical thickness (total thickness) but had the multilayer structure of the IrMn layer and the PtMn layer (Comparative example 9).

Examples 11 to 15 and Comparative Examples 11 to 15

Figure 21:
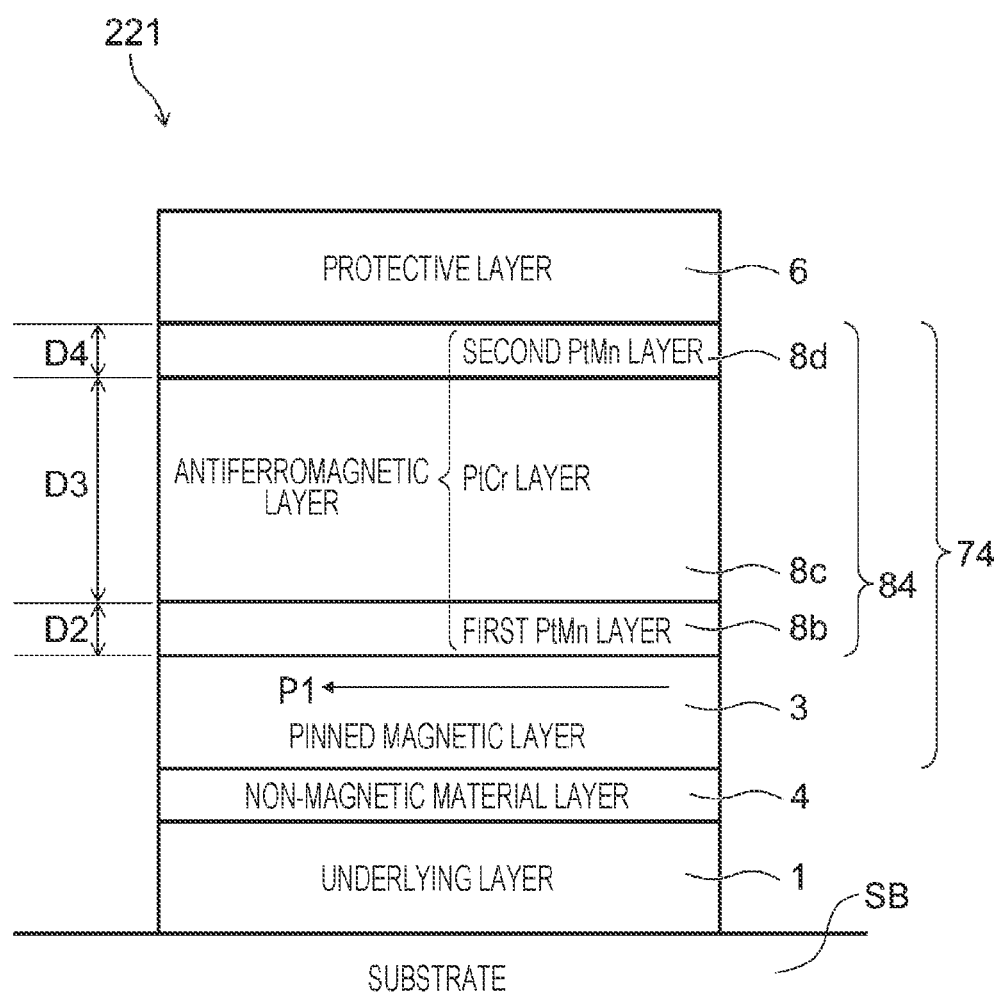
FIG. 21 illustrates the layer structure of a multilayer stack 221 according to Example 21.

Multilayer stacks 22 and 221 having layer structures described below (see FIGS. 6 and 21) were produced for the purpose of evaluating the characteristics of exchange-coupled films 40 and 74. In the following examples and comparative examples, values given in parentheses represent the thickness (Å). The multilayer stacks 22 and 221 were subjected to annealing treatment at 350° C. for 20 hours in a magnetic field of 10 kOe to pin the magnetization of the pinned magnetic layer 3 formed of a ferromagnetic layer and the antiferromagnetic layer 2, thereby producing the multilayer stacks 22 and 221 including the exchange-coupled film 40.

Substrate SB: silicon substrate including alumina layer formed on surface/underlying layer 1: NiFeCr (42)/nonmagnetic material layer 4: [Cu (30)/Ru (20)]/pinned magnetic layer 3: $Co_{40at\%}Fe_{60at\%}$ (100)/antiferromagnetic layer 2 [IrMn layer 2a: $Ir_{22at\%}Mn_{78at\%}$ (d1)/first PtMn layer 2b: $Pt_{50at\%}Mn_{50at\%}$ (d2)/PtCr layer 2c: $Pt_{51at\%}Cr_{49at\%}$ (d3)/second PtMn layer 2d: $Pt_{50at\%}Mn_{50at\%}$ (d4)]/protective layer 6: [Ru (20)/Ta (100)]

The IrMn layers 2a had different thicknesses d1 ranging from 0 Å to 80 Å. The first PtMn layers 2b had different thicknesses d2 ranging from 0 Å to 300 Å. The PtCr layers 2c had different thicknesses d3 ranging from 0 Å to 250 Å. The second PtMn layers 2d had different thicknesses d4 ranging from 0 Å to 30 Å. Table 3 presents d1 to d4 and the thickness (total thickness) of the entire antiferromagnetic layer 2 in each of the examples and comparative examples.

TABLE 3

| | Thickness of antiferromagnetic layer (Å) | | | | | | |
|---|---|---|---|---|---|---|---|
| | d1 | d2 | d3 | d4 | Total thickness | Hex (Oe) | Hc (Oe) | Hex/Hc |
| Comparative example 11 | 0 | 0 | 180 | 0 | 180 | 46 | 162 | 0.29 |
| Comparative example 12 | 0 | 20 | 160 | | 180 | 116 | 354 | 0.33 |
| Comparative example 13 | 8 | 12 | 160 | | 180 | 139 | 217 | 0.64 |
| Comparative example 14 | 0 | 300 | 0 | | 300 | 140 | 166 | 0.84 |

TABLE 3-continued

| | Thickness of antiferromagnetic layer (Å) | | | | | | |
|---|---|---|---|---|---|---|---|
| | d1 | d2 | d3 | d4 | Total thickness | Hex (Oe) | Hc (Oe) | Hex/Hc |
| Comparative example 15 | 80 | 0 | 0 | | 80 | 114 | 143 | 0.80 |
| Example 11 | 8 | 12 | 110 | 30 | 160 | 184 | 215 | 0.85 |
| Example 12 | | | 130 | | 180 | 227 | 190 | 1.19 |
| Example 13 | | | 150 | | 200 | 259 | 185 | 1.40 |
| Example 14 | | | 250 | | 300 | 263 | 139 | 1.90 |
| Example 15 | 0 | 20 | 250 | 30 | 300 | 363 | 377 | 0.96 |

Magnetization curves of the exchange-coupled films 40 according to the examples and the comparative examples were measured with a vibrating sample magnetometer (VSM). The exchange coupling fields Hex (unit: Oe), the coercive forces Hc (unit: Oe), and the ratios (Hex/Hc) of the exchange coupling fields Hex to the coercive forces Hc were determined from the resulting hysteresis loops. Table 3 presents the results.

Figure 11:
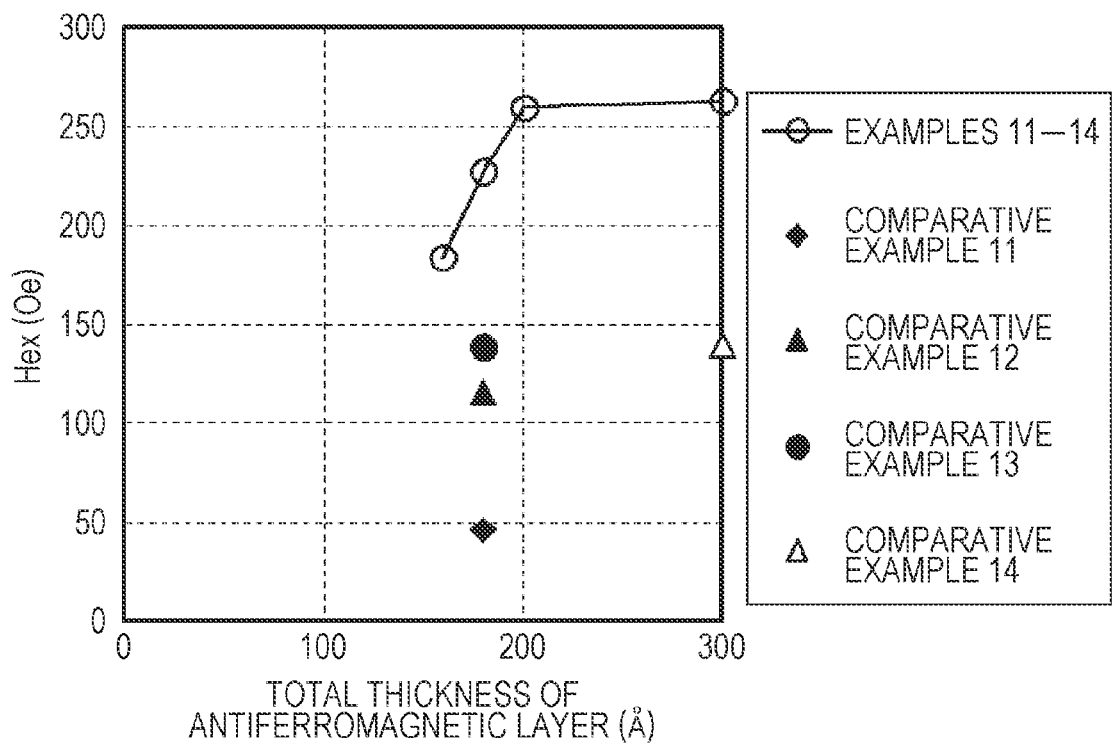
FIG. 11 is a graph illustrating the dependence of the exchange coupling field Hex on the total thickness of the antiferromagnetic layer.
Figure 12:
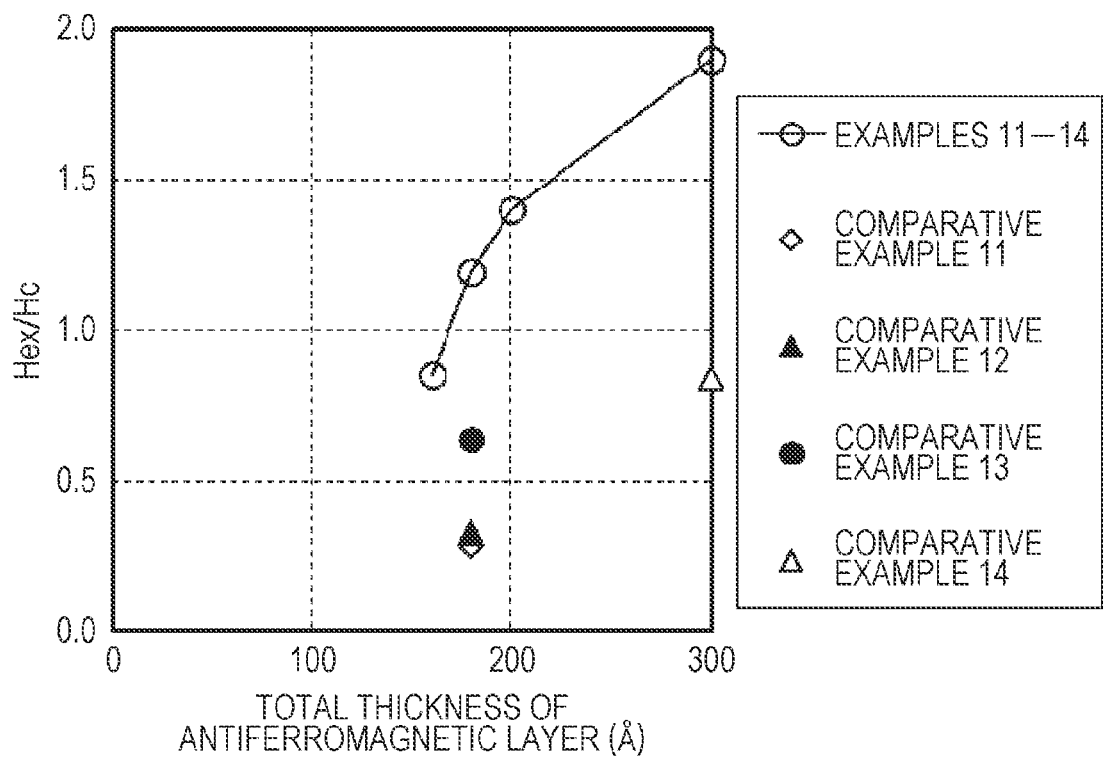
FIG. 12 is a graph illustrating the dependence of the ratio (Hex/Hc) of the exchange coupling field Hex to the coercive force Hc on the total thickness of the antiferromagnetic layer.

FIG. 11 is based on the results presented in Table 3 and is a graph illustrating the dependence of the exchange coupling field Hex on the thickness (total thickness) of the antiferromagnetic layer 2. FIG. 12 is based on the results presented in Table 3 and is a graph illustrating the dependence of the ratio (Hex/Hc) of the exchange coupling field Hex to the coercive force Hc on the thickness (total thickness) of the antiferromagnetic layer 2. As is clear from Table 3 and FIGS. 11 and 12, the exchange coupling fields Hex of the exchange-coupled films 40 including the antiferromagnetic layers 2 having the structures according to Examples 11 to 14 were larger than those of the exchange-coupled films 40 including the antiferromagnetic layers 2 having the structures according to Comparative examples 11 to 14. Comparisons of Examples 11 to 14 indicated that a larger thickness d3 of the PtCr layer 2c resulted in a higher exchange coupling field Hex and higher Hex/Hc and that in the exchange-coupled films 40 including the antiferromagnetic layers 2 having the structures according to Examples 12 to 14, Hex/Hc was more than 1. Accordingly, magnetic sensing elements (for example, magnetoresistive elements) including the exchange-coupled films according to Examples 11 to 14 can appropriately function as sensors even in a strong magnetic field environment, in other words, have strong-magnetic field resistance. In particular, the magnetic sensing elements including the exchange-coupled films according to Examples 12 to 14 have excellent strong-magnetic field resistance because the magnetization directions are aligned in the directions based on the exchange coupling fields Hex when the application of an external magnetic field is released.

Magnetization curves of the exchange-coupled films 40 according to Comparative examples 11 to 15 and Examples 11 to 15 were measured at different environmental temperatures (unit: ° C.) with a vibrating sample magnetometer (VSM). The exchange coupling fields Hex (unit: Oe) at the temperatures were determined from the resulting hysteresis loops. Tables 4 to 12 present the exchange coupling fields Hex at the temperatures and values obtained by normalizing the exchange coupling fields Hex at the temperatures to the exchange coupling field Hex at room temperature (normalized exchange coupling fields with respect to room temperature).

TABLE 4

| Comparative example 11 | | |
|---|---|---|
| Temperature (° C.) | Hex (Oe) | Normalized Hex |
| 25 | 48 | 1.00 |
| 50 | 48 | 0.99 |
| 80 | 47 | 0.97 |
| 110 | 47 | 0.97 |
| 140 | 46 | 0.96 |
| 170 | 45 | 0.93 |
| 200 | 43 | 0.89 |
| 230 | 42 | 0.87 |
| 260 | 40 | 0.83 |
| 290 | 37 | 0.76 |
| 320 | 30 | 0.62 |
| 350 | 25 | 0.52 |
| 380 | 20 | 0.41 |
| 410 | 13 | 0.27 |
| 440 | 10 | 0.21 |
| 470 | 3 | 0.06 |
| 500 | 0 | 0.00 |

TABLE 5

| Comparative example 12 | | |
|---|---|---|
| Temperature (° C.) | Hex (Oe) | Normalized Hex |
| 25 | 98 | 1.00 |
| 50 | 96 | 0.98 |
| 80 | 90 | 0.92 |
| 110 | 84 | 0.85 |
| 140 | 82 | 0.83 |
| 170 | 75 | 0.76 |
| 200 | 72 | 0.73 |
| 230 | 63 | 0.64 |
| 260 | 57 | 0.58 |
| 290 | 50 | 0.51 |
| 320 | 40 | 0.41 |
| 350 | 36 | 0.37 |
| 380 | 29 | 0.29 |
| 410 | 20 | 0.20 |
| 440 | 10 | 0.10 |
| 470 | 3 | 0.03 |
| 500 | 0 | 0.00 |

TABLE 6

| Comparative example 13 | | |
|---|---|---|
| Temperature (° C.) | Hex (Oe) | Normalized Hex |
| 25 | 135 | 1.00 |
| 50 | 125 | 0.93 |
| 80 | 124 | 0.92 |
| 110 | 118 | 0.88 |
| 140 | 113 | 0.84 |
| 170 | 109 | 0.81 |
| 200 | 101 | 0.75 |
| 230 | 97 | 0.72 |
| 260 | 87 | 0.65 |
| 290 | 78 | 0.58 |
| 320 | 64 | 0.48 |
| 350 | 40 | 0.30 |
| 380 | 27 | 0.20 |
| 410 | 9 | 0.07 |
| 440 | 0 | 0.00 |

TABLE 7

Comparative example 14

| Temperature (° C.) | Hex (Oe) | Normalized Hex |
|---|---|---|
| 22 | 140 | 1.00 |
| 44 | 140 | 1.00 |
| 65 | 139 | 0.99 |
| 85 | 137 | 0.98 |
| 105 | 136 | 0.97 |
| 125 | 135 | 0.96 |
| 145 | 134 | 0.96 |
| 165 | 129 | 0.92 |
| 185 | 124 | 0.88 |
| 204 | 116 | 0.83 |
| 224 | 106 | 0.76 |
| 268 | 72 | 0.52 |
| 306 | 34 | 0.24 |
| 323 | 16 | 0.11 |
| 342 | 8 | 0.06 |
| 362 | 3 | 0.02 |
| 380 | 0 | 0.00 |

TABLE 8

Comparative example 15

| Temperature (° C.) | Hex (Oe) | Normalized Hex |
|---|---|---|
| 22 | 114 | 1.00 |
| 42 | 110 | 0.97 |
| 64 | 104 | 0.91 |
| 84 | 96 | 0.85 |
| 105 | 90 | 0.79 |
| 125 | 82 | 0.72 |
| 144 | 74 | 0.65 |
| 165 | 66 | 0.58 |
| 185 | 56 | 0.49 |
| 205 | 39 | 0.34 |
| 224 | 22 | 0.20 |
| 244 | 6 | 0.05 |
| 264 | 0 | 0.00 |

TABLE 9

Example 11

| Temperature (° C.) | Hex (Oe) | Normalized Hex |
|---|---|---|
| 25 | 187 | 1.00 |
| 50 | 180 | 0.96 |
| 80 | 169 | 0.91 |
| 110 | 163 | 0.87 |
| 140 | 156 | 0.83 |
| 170 | 151 | 0.81 |
| 200 | 143 | 0.77 |
| 230 | 138 | 0.74 |
| 260 | 120 | 0.64 |
| 290 | 107 | 0.57 |
| 320 | 83 | 0.44 |
| 350 | 52 | 0.28 |
| 380 | 22 | 0.12 |
| 410 | 4 | 0.02 |
| 440 | 0 | 0 |

TABLE 10

Example 12

| Temperature (° C.) | Hex (Oe) | Normalized Hex |
|---|---|---|
| 25 | 225 | 1.00 |
| 50 | 225 | 1.00 |
| 80 | 218 | 0.97 |
| 110 | 214 | 0.95 |
| 140 | 207 | 0.92 |
| 170 | 199 | 0.88 |
| 200 | 190 | 0.84 |
| 230 | 187 | 0.83 |
| 260 | 180 | 0.80 |
| 290 | 149 | 0.66 |
| 320 | 98 | 0.44 |
| 350 | 67 | 0.30 |
| 380 | 31 | 0.14 |
| 410 | 7 | 0.03 |
| 440 | 0 | 0.00 |

TABLE 11

Example 13

| Temperature (° C.) | Hex (Oe) | Normalized Hex |
|---|---|---|
| 23 | 253 | 1.00 |
| 50 | 250 | 0.99 |
| 80 | 239 | 0.94 |
| 110 | 235 | 0.93 |
| 140 | 238 | 0.94 |
| 170 | 217 | 0.86 |
| 200 | 217 | 0.86 |
| 230 | 200 | 0.79 |
| 260 | 195 | 0.77 |
| 290 | 175 | 0.69 |
| 320 | 127 | 0.50 |
| 350 | 77 | 0.30 |
| 380 | 37 | 0.15 |
| 410 | 8 | 0.03 |
| 440 | 0 | 0.00 |

TABLE 12

| Example 14 | | | Example 15 | | |
|---|---|---|---|---|---|
| Temperature (° C.) | Hex (Oe) | Normalized Hex | Temperature (° C.) | Hex (Oe) | Normalized Hex |
| 23 | 282 | 1.00 | 23 | 360 | 1.00 |
| 50 | 279 | 0.99 | 50 | 353 | 0.98 |
| 80 | 263 | 0.93 | 80 | 351 | 0.98 |
| 110 | 265 | 0.94 | 110 | 344 | 0.96 |
| 140 | 262 | 0.93 | 140 | 333 | 0.93 |
| 170 | 257 | 0.91 | 170 | 314 | 0.87 |
| 200 | 248 | 0.88 | 200 | 298 | 0.83 |
| 230 | 236 | 0.84 | 230 | 290 | 0.81 |
| 260 | 223 | 0.79 | 260 | 266 | 0.74 |
| 290 | 198 | 0.70 | 290 | 244 | 0.68 |
| 320 | 148 | 0.52 | 320 | 216 | 0.60 |
| 350 | 75 | 0.27 | 350 | 198 | 0.55 |
| 380 | 30 | 0.11 | 380 | 167 | 0.46 |
| 410 | 8 | 0.03 | 410 | 145 | 0.40 |
| 440 | 0 | 0.00 | 440 | 106 | 0.29 |
| | | | 470 | 66 | 0.18 |
| | | | 500 | 22 | 0.06 |

The blocking temperatures Tb (unit: ° C.) in these examples were determined on the basis of the results presented in Tables 4 to 12. Table 13 presents the results. As presented in Table 13, the exchange-coupled films 40 including the IrMn layers 2a serving as Mn-containing layers (Examples 11 to 14) had a blocking temperature Tb of 410° C. The exchange-coupled film 74 having no Mn-containing layer (exchange-coupled film 74 according to Example 15) had a blocking temperature Tb of 510° C. Accordingly, it was suggested that it may be preferable to use the exchange-coupled film 74 having no Mn-containing layer.

TABLE 13

|  | Tb (° C.) |
|---|---|
| Comparative example 11 | 470 |
| Comparative example 12 | 470 |
| Comparative example 13 | 410 |
| Comparative example 14 | 362 |
| Comparative example 15 | 244 |
| Example 11 | 410 |
| Example 12 | 410 |
| Example 13 | 410 |
| Example 14 | 410 |
| Example 15 | 510 |

Figure 13:
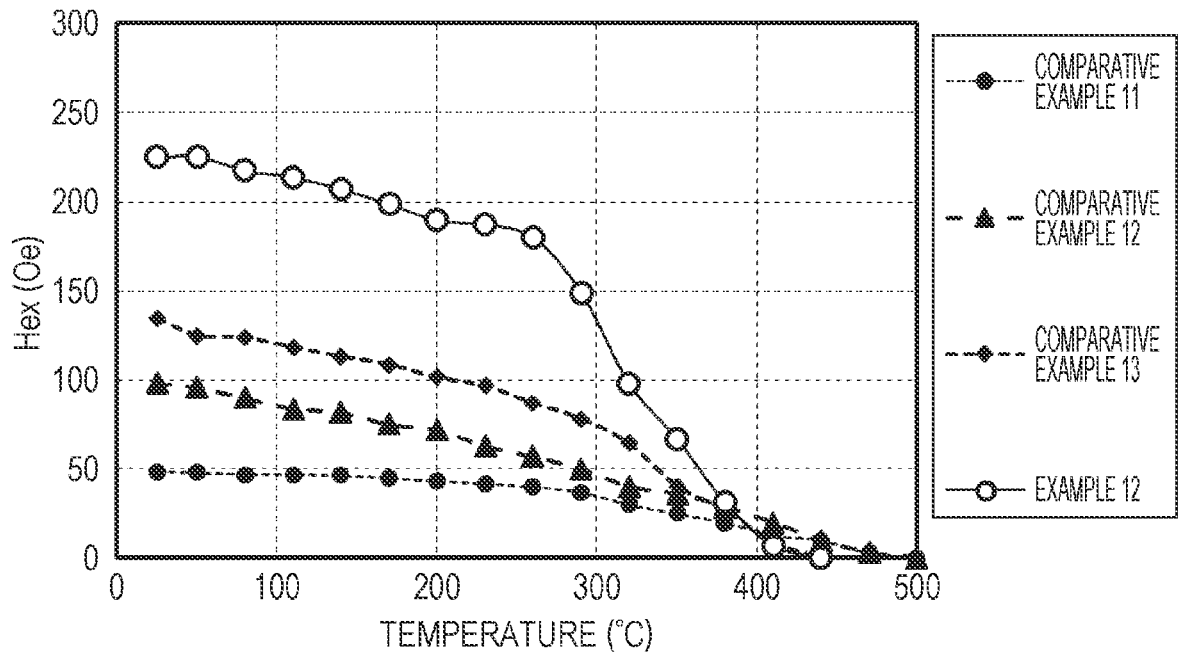
FIG. 13 is a graph illustrating the dependence of the exchange coupling field Hex on measurement temperature in Comparative examples 11 to 13 and Example 12.
Figure 14:
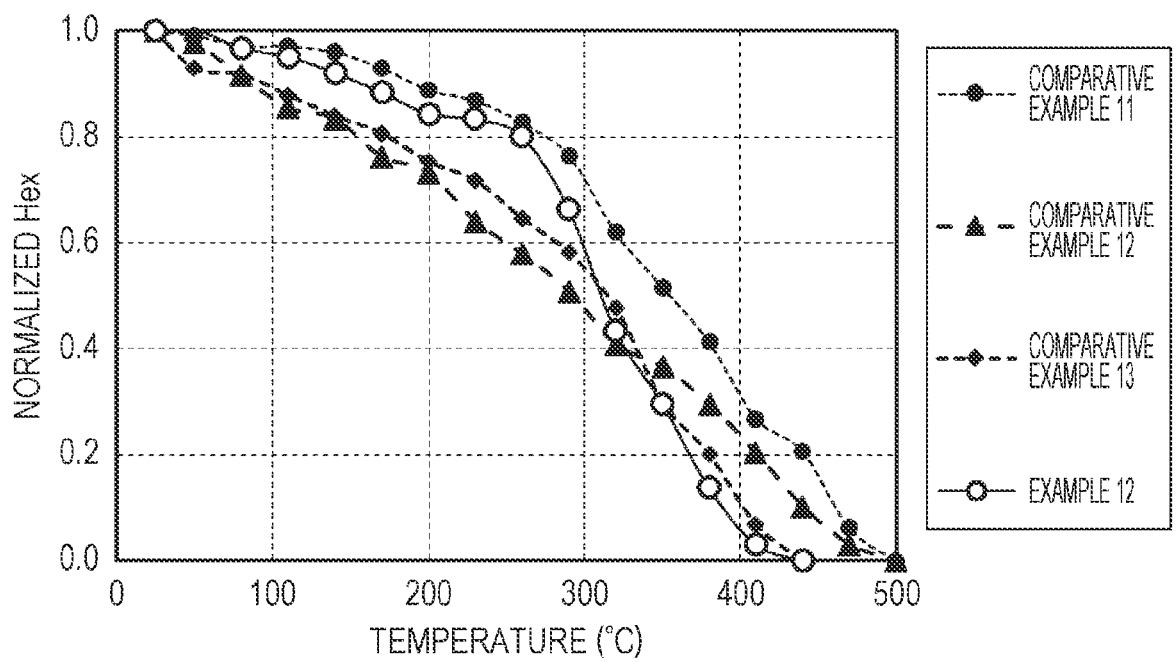
FIG. 14 is a graph illustrating the dependence of the ratio (Hex/Hc) of the exchange coupling field Hex to the coercive force Hc on measurement temperature in Comparative examples 11 to 13 and Example 12.
Figure 15:
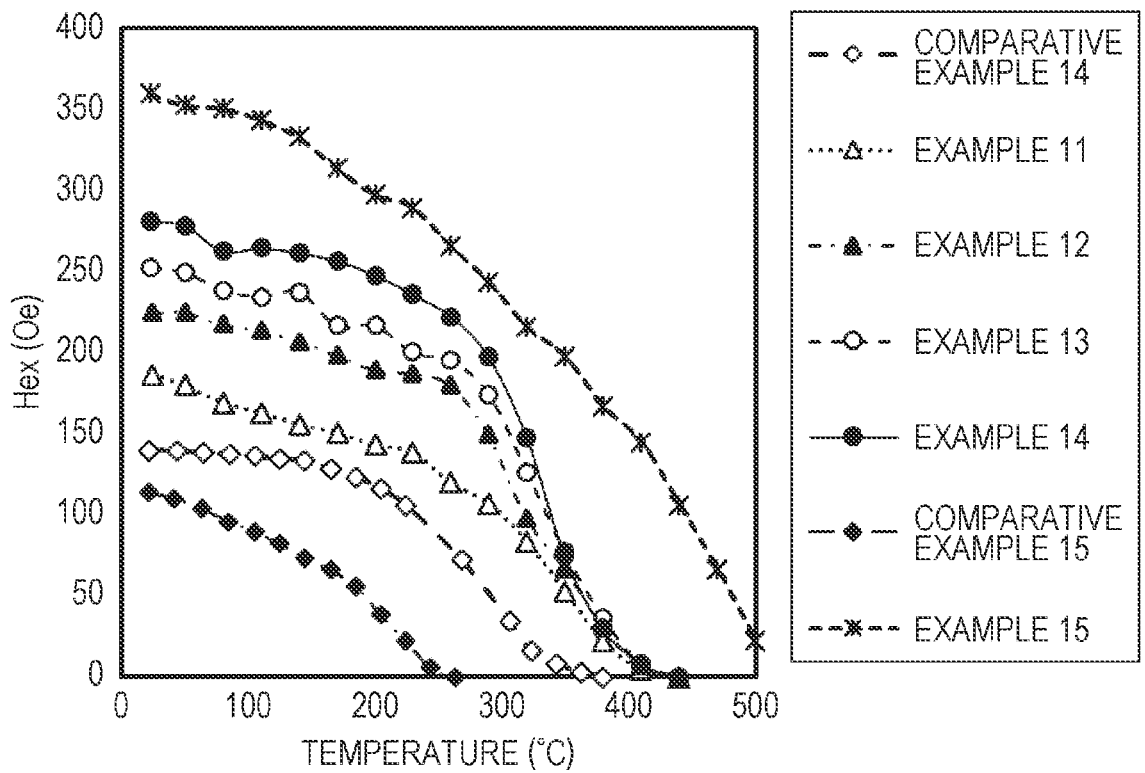
FIG. 15 is a graph illustrating the dependence of the exchange coupling field Hex on measurement temperature in Comparative examples 14 and 15 and Examples 11 to 15.
Figure 16:
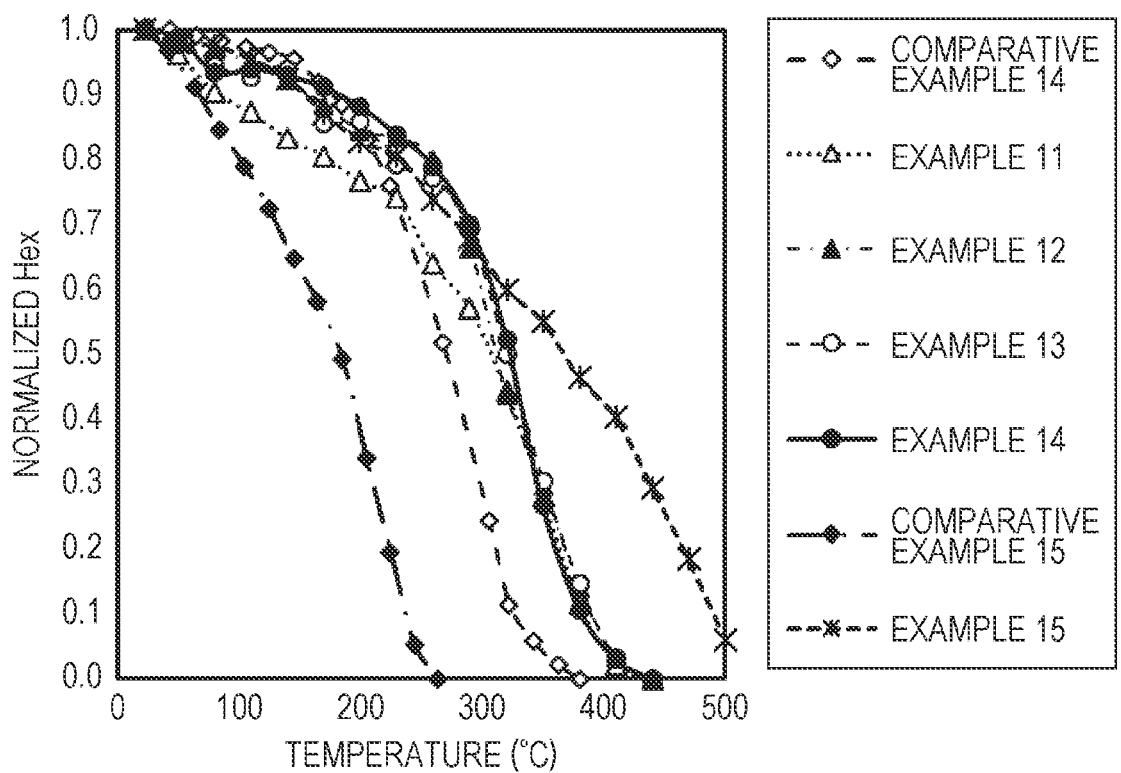
FIG. 16 is a graph illustrating the dependence of the ratio (Hex/Hc) of the exchange coupling field Hex to the coercive force Hc on measurement temperature in in Comparative examples 14 and 15 and Examples 11 to 15.

FIG. 13 is a graph illustrating the dependence of the exchange coupling fields Hex of the exchange-coupled films 40 according to Comparative examples 11 to 13 and Example 12 on measurement temperature. FIG. 14 is a graph illustrating the dependence of the normalized exchange coupling fields Hex with respect to room temperature of the exchange-coupled films 40 according to Comparative examples 11 to 13 and Example 12 on measurement temperature. FIG. 15 is a graph illustrating the dependence of the exchange coupling fields Hex of the exchange-coupled films 40 according to Comparative examples 14 and 15 and Examples 11 to 15 on measurement temperature. FIG. 16 is a graph illustrating the dependence of the normalized exchange coupling fields Hex with respect to room temperature of the exchange-coupled films 40 according to Comparative examples 14 and 15 and Examples 11 to 15.

In FIGS. 13 and 14, comparisons are made at a total thickness of the antiferromagnetic layer 2 of 180 Å: the case where the antiferromagnetic layer 2 consists only of the PtCr layer (Comparative example 11), the case where a portion of the PtCr layer adjacent to the pinned magnetic layer 3 is replaced with the PtMn layer (Comparative example 12) in comparison with Comparative example 11, the case where a portion of the PtMn layer adjacent to the pinned magnetic layer 3 is replaced with the IrMn layer (Comparative example 13) in comparison with Comparative example 12, and the case where a portion of the PtCr layer adjacent to the protective layer 6 is replaced with the PtMn layer (Example 12) in comparison with Comparative example 13. In Comparative example 11, the exchange coupling field Hex was 50 Oe or less. The replacement of the portion of the PtCr layer adjacent to the pinned magnetic layer 3 with the PtMn layer enabled the enhancement of the exchange coupling field Hex to about 100 Oe or less (Comparative example 12). Moreover, the replacement of the portion of the PtMn layer adjacent to the pinned magnetic layer 3 with the IrMn layer enabled the enhancement of the exchange coupling field Hex to about 150 Oe or less (Comparative example 13). The blocking temperature Tb of the exchange-coupled film 40, however, decreased by about 50° C. Additionally, the replacement of the portion of the PtCr layer adjacent to the protective layer 6 with the PtMn layer enabled the enhancement of the exchange coupling field Hex to about 200 Oe (Example 12).

In FIGS. 15 and 16, comparisons are made between the antiferromagnetic layers 2 having the structures according to the examples and the cases where only a film located between the PtCr layer and the pinned magnetic layer 3 constituted each antiferromagnetic layer 2. Specifically, in Comparative example 14, the antiferromagnetic layer 2 was formed of the PtMn layer. In Comparative example 15, the antiferromagnetic layer 2 was formed of the IrMn layer. As is particularly clear in FIG. 16, the blocking temperatures Tb of the exchange-coupled films 40 according to the examples were about 410° C. regardless of the thicknesses of the PtCr layers. The blocking temperature Tb of the exchange-coupled film 40 including any of the antiferromagnetic layer 2 consisting of the PtMn layer and including the antiferromagnetic layer 2 consisting of the IrMn layer was lower than the blocking temperatures Tb of the exchange-coupled films 40 according to the examples. Accordingly, the exchange-coupled film according to an embodiment of the present invention can function stably in a high-temperature environment, compared with exchange-coupled films according to the related art. The blocking temperature Tb of the exchange-coupled film 74 according to Example 15 was higher than the blocking temperature Tb of the exchange-coupled film 40; thus, the exchange-coupled film 74 according to Example 15 should function appropriately in a particularly harsh high-temperature environment.

Example 21

A multilayer stack 221 having a layer structure described below (see FIG. 21) was produced for the purpose of evaluating the characteristics of the exchange-coupled film 74. In the following examples and comparative examples, values given in parentheses represent the thickness (Å). The multilayer stack 221 was subjected to annealing treatment at 350° C. for 20 hours in a magnetic field of 15 kOe to pin the magnetization of the pinned magnetic layer 3 formed of a ferromagnetic layer and an antiferromagnetic layer 84, thereby producing the multilayer stack 221 including the exchange-coupled film 74.

Substrate SB: silicon substrate including alumina layer formed on surface/underlying layer 1: NiFeCr (42)/non-magnetic material layer 4: [Cu (30)/Ru (10)]/pinned magnetic layer 3: $Co_{40at\%}Fe_{60at\%}$ (18)/antiferromagnetic layer 84 [first PtMn layer 8b: $Pt_{50at\%}Mn_{50at\%}$ (16)/PtCr layer 8c: $Pt_{51at\%}Cr_{49at\%}$ (130)/second PtMn layer 8d: $Pt_{50at\%}Mn_{50at\%}$ (30)]/protective layer 6: Ta (100)

Examples 22 to 26

Multilayer stacks 22 having a layer structure described below (see FIG. 6) were produced for the purpose of evaluating the characteristics of the exchange-coupled film 40. In the following examples and comparative examples, values given in parentheses represent the thickness (Å). Each of the multilayer stacks 22 was subjected to annealing treatment at 350° C. for 20 hours in a magnetic field of 15 kOe to pin the magnetization of the pinned magnetic layer 3 formed of a ferromagnetic layer and the antiferromagnetic layer 2, thereby producing the multilayer stack 22 including the exchange-coupled film 40.

Substrate SB: silicon substrate including alumina layer formed on surface/underlying layer 1: NiFeCr (42)/non-magnetic material layer 4: [Cu (30)/Ru (10)]/pinned magnetic layer 3: $Co_{40at\%}Fe_{60at\%}$ (18)/antiferromagnetic layer 2 [IrMn layer 2a: $Ir_{20at\%}Mn_{80at\%}$ (d1)/first PtMn layer 2b: $Pt_{50at\%}Mn_{50at\%}$ (16)/PtCr layer 2c: $Pt_{51at\%}Cr_{49at\%}$ (130)/second PtMn layer 2d: $Pt_{50at\%}Mn_{50at\%}$ (30)]/protective layer 6: Ta (100)

The IrMn layers 2a had different thicknesses d1 ranging from 2 Å to 10 Å. Table 14 presents d1 in each of the examples.

TABLE 14

| | Thickness of antiferromagnetic layer (Å) | | | | | Hex | Hc | |
|---|---|---|---|---|---|---|---|---|
| | Mn layer or IrMn layer | First PtMn layer | PtCr layer | Second PtMn layer | Total | (Oe) | (Oe) | Hex/Hc |
| Example 21 | IrMn layer 0 | 16 | 130 | 30 | 176 | 1,950 | 1,550 | 1.26 |
| Example 22 | 2 | | | | 178 | 2,350 | 1,350 | 1.74 |
| Example 23 | 4 | | | | 180 | 2,000 | 1,100 | 1.82 |
| Example 24 | 6 | | | | 182 | 1,800 | 1,000 | 1.80 |
| Example 25 | 8 | | | | 184 | 1,450 | 850 | 1.71 |
| Example 26 | 10 | | | | 186 | 1,315 | 865 | 1.52 |
| Example 21 | Mn layer 0 | | | | 176 | 1,950 | 1,550 | 1.26 |
| Example 27 | 2 | | | | 178 | 2,450 | 1,750 | 1.40 |
| Example 28 | 4 | | | | 180 | 2,250 | 1,700 | 1.32 |
| Example 29 | 6 | | | | 182 | 2,000 | 1,550 | 1.29 |
| Example 30 | 8 | | | | 184 | 1,900 | 1,400 | 1.36 |
| Example 31 | 10 | | | | 186 | 1,725 | 1,125 | 1.53 |

Examples 27 to 31

Multilayer stacks 222 having a layer structure described below (see FIG. 22) were produced for the purpose of evaluating the characteristics of exchange-coupled films 75. In the following examples and comparative examples, values given in parentheses represent the thickness (Å). The multilayer stack 222 was subjected to annealing treatment at 350° C. for 20 hours in a magnetic field of 15 kOe to pin the magnetization of the pinned magnetic layer 3 formed of a ferromagnetic layer and an antiferromagnetic layer 85, thereby producing the multilayer stack 222 including the exchange-coupled film 75.

Substrate SB: silicon substrate including alumina layer formed on surface/underlying layer 1: NiFeCr (42)/nonmagnetic material layer 4: [Cu (30)/Ru (10)]/pinned magnetic layer 3: $Co_{40at\%}Fe_{60at\%}$ (18)/antiferromagnetic layer 85 [Mn layer 8a1: Mn (D1)/first PtMn layer 8b: $Pt_{50at\%}Mn_{50at\%}$ (16)/PtCr layer 8c: $Pt_{51at\%}Cr_{49at\%}$ (130)/second PtMn layer 8d: $Pt_{50at\%}Mn_{50at\%}$ (30)]/protective layer 6: Ta (100)

The Mn layers 8a1 had different thicknesses D1 ranging from 2 Å to 10 Å. Table 14 presents D1 in each of the examples.

Magnetization curves of the exchange-coupled films 74, 40, and 75 according to the examples were measured with a vibrating sample magnetometer (VSM). The exchange coupling fields Hex (unit: Oe), the coercive forces Hc (unit: Oe), and the ratios (Hex/Hc) of the exchange coupling fields Hex to the coercive forces Hc were determined from the resulting hysteresis loops. Table 14 and FIG. 22 present the results.

Figure 22:
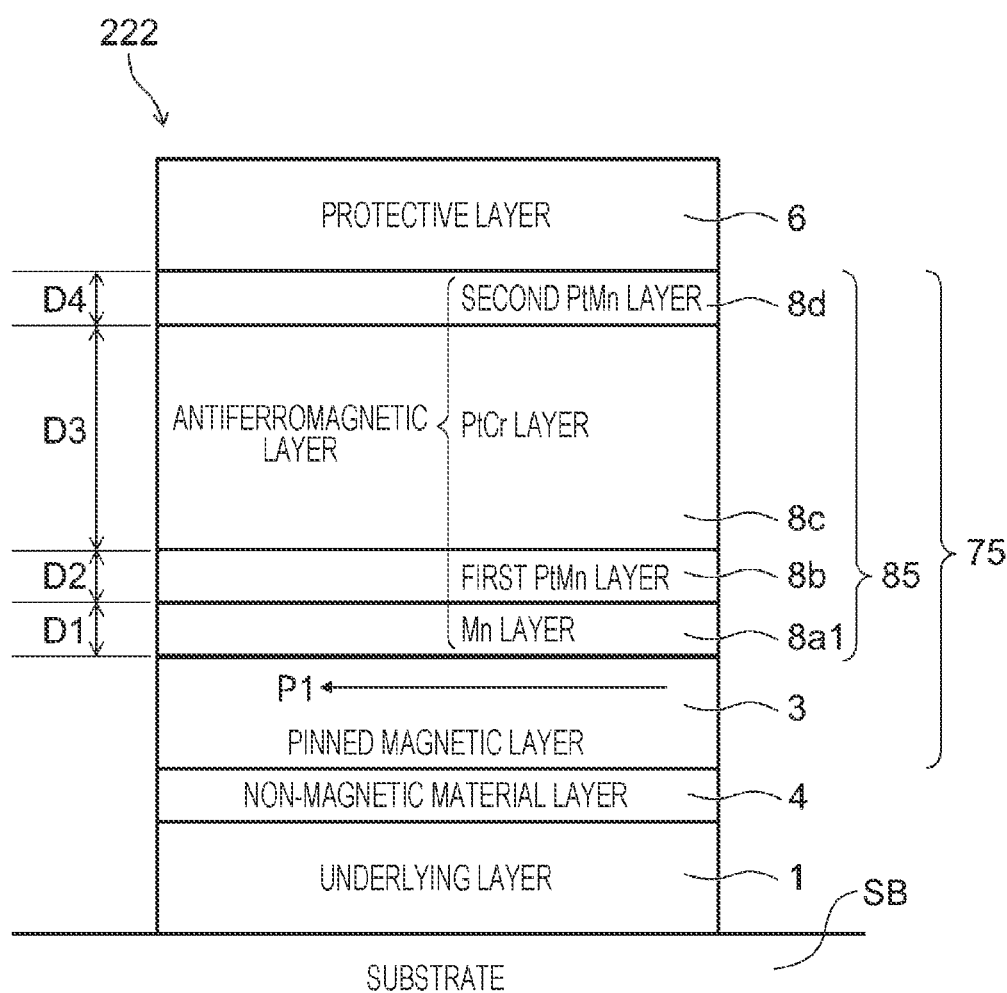
FIG. 22 illustrates the layer structure of a multilayer stack according to Examples 27 to 31.
Figure 23:
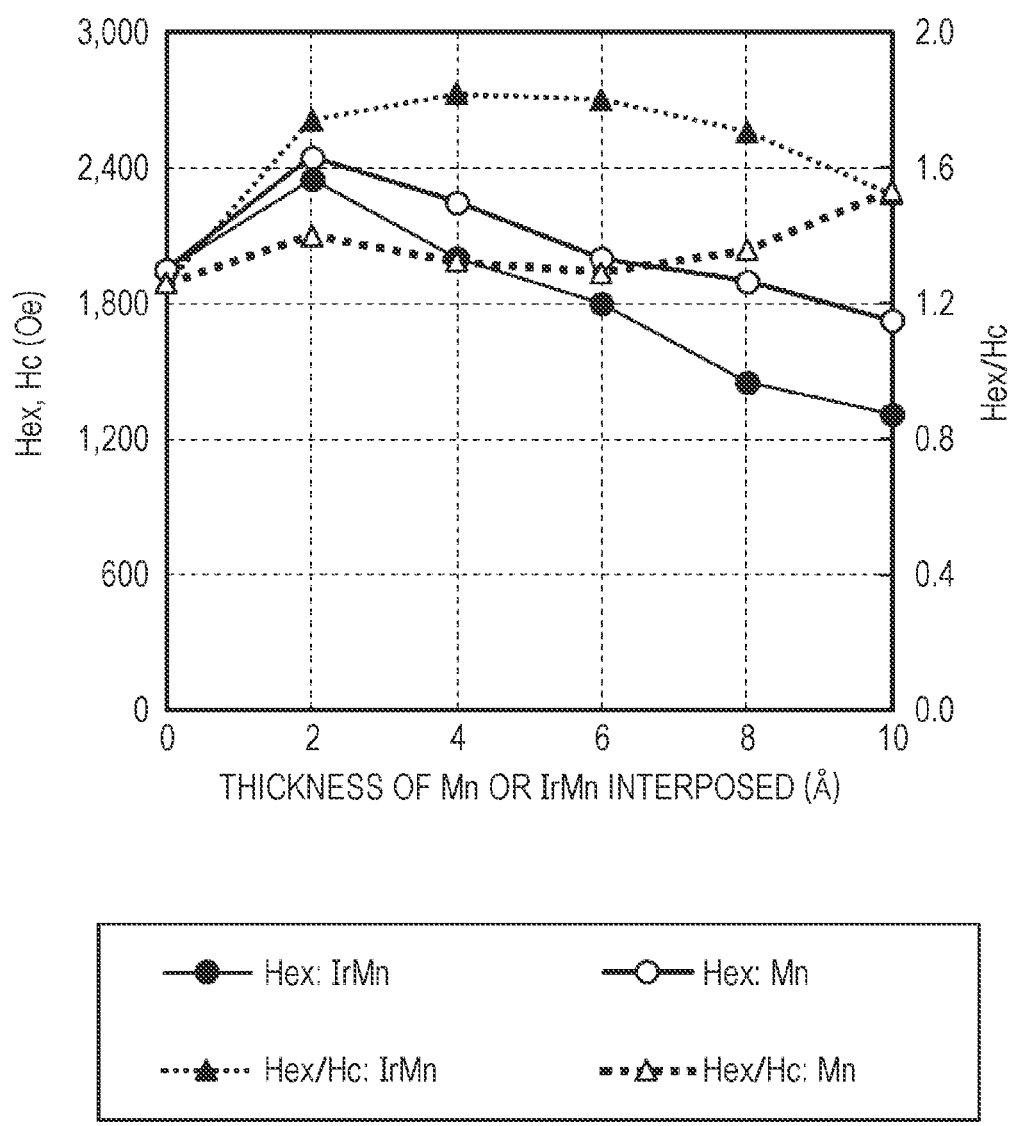
FIG. 23 is a graph illustrating the relationship between the exchange coupling field Hex (left vertical axis) and the thickness of a Mn-containing layer (thickness of Mn or IrMn interposed) and between the ratio (Hex/Hc) (right vertical axis) of the exchange coupling field Hex to the coercive force Hc and the thickness of the Mn-containing layer (thickness of Mn or IrMn interposed)

As presented in Table 14 and FIG. 22, the exchange-coupled films 74, 40, and 75 according to Examples 21 to 31 had high exchange coupling fields Hex. In each of the exchange-coupled films 74, 40, and 75 according to Examples 21 to 31, Hex/Hc was more than 1. Accordingly, magnetic sensing elements (for example, magnetoresistive elements) including the exchange-coupled films according to Examples 21 to 31 can exhibit excellent magnetic properties even in a strong magnetic field environment.

Examples 41 to 48 and Comparative Examples 41 to 47

Multilayer stacks 221 having a layer structure described below (see FIG. 21) were produced for the purpose of evaluating the characteristics of exchange-coupled films 74. In the following examples and comparative examples, values given in parentheses represent the thickness (Å). Each of the multilayer stacks 221 was subjected to annealing treatment at 350° C. for 20 hours in a magnetic field of 10 kOe to pin the magnetization of the pinned magnetic layer 3 formed of a ferromagnetic layer and an antiferromagnetic layer 84, thereby producing the multilayer stack 221 including the exchange-coupled film 74.

Substrate SB: silicon substrate including alumina layer formed on surface/underlying layer 1: NiFeCr (42)/nonmagnetic material layer 4: [Cu (30)/Ru (10)]/pinned magnetic layer 3: $Co_{90at\%}Fe_{10at\%}$ (100)/antiferromagnetic layer 84 [first PtMn layer 8b: $Pt_{50at\%}Mn_{50at\%}$ (D2)/PtCr layer 8c: $Pt_{51at\%}Cr_{49at\%}$ (D3)/second PtMn layer 8d: $Pt_{50at\%}Mn_{50at\%}$ (D4)]/protective layer 6: Ta (100)

The thickness D2 of each first PtMn layer 8b was 0 Å or 20 Å. The PtCr layers 8c had different thicknesses D3 ranging from 0 Å to 180 Å. The second PtMn layers 8d had different thicknesses D4 ranging from 0 Å to 160 Å. The overall thickness (total thickness) of each of the antiferromagnetic layers 84 was fixed at 180 Å. Table 15 presents D2, D3, and D4 in each of the examples.

TABLE 15

| | Thickness of antiferromagnetic layer (Å) | | | | | | |
|---|---|---|---|---|---|---|---|
| | D2 | D3 | D4 | Total thickness | Hex (Oe) | Hc (Oe) | Hex/Hc |
| Comparative example 41 | 0 | 180 | 0 | 180 | 3 | 29 | 0.10 |
| Comparative example 42 | | 150 | 30 | | 14 | 38 | 0.37 |
| Comparative example 43 | 20 | 160 | 0 | | 20 | 120 | 0.17 |
| Example 41 | | 150 | 10 | | 23 | 123 | 0.18 |
| Example 42 | | 140 | 20 | | 215 | 385 | 0.56 |
| Example 43 | | 130 | 30 | | 305 | 520 | 0.59 |
| Example 44 | | 120 | 40 | | 257 | 523 | 0.49 |
| Example 45 | | 100 | 60 | | 120 | 470 | 0.26 |

TABLE 15-continued

| | Thickness of antiferromagnetic layer (Å) | | | | | | |
|---|---|---|---|---|---|---|---|
| | D2 | D3 | D4 | Total thickness | Hex (Oe) | Hc (Oe) | Hex/Hc |
| Example 46 | | 80 | 80 | | 66 | 426 | 0.15 |
| Example 47 | | 60 | 100 | | 60 | 365 | 0.16 |
| Example 48 | | 40 | 120 | | 60 | 370 | 0.16 |
| Comparative example 44 | | 20 | 140 | | 57 | 378 | 0.15 |
| Comparative example 45 | | 10 | 150 | | 85 | 375 | 0.23 |
| Comparative example 46 | | 5 | 155 | | 98 | 358 | 0.27 |
| Comparative example 47 | | 0 | 160 | | 160 | 330 | 0.48 |

Magnetization curves of the exchange-coupled films 74 according to the examples were measured with a vibrating sample magnetometer (VSM). The exchange coupling fields Hex (unit: Oe), the coercive forces Hc (unit: Oe), and the ratios (Hex/Hc) of the exchange coupling fields Hex to the coercive forces Hc were determined from the resulting hysteresis loops. Table 15 and FIGS. 24 and 25 present the results.

Figure 24:
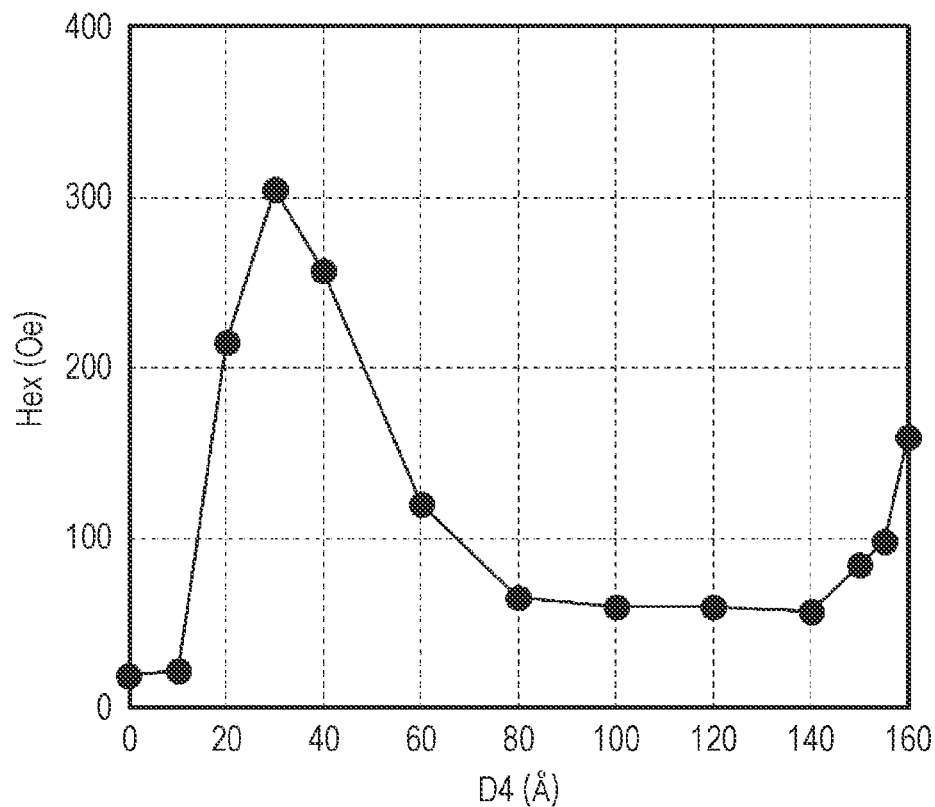
FIG. 24 is a graph illustrating the dependence of the exchange coupling field Hex on the thickness D4 of a second PtMn layer 8d.
Figure 25:
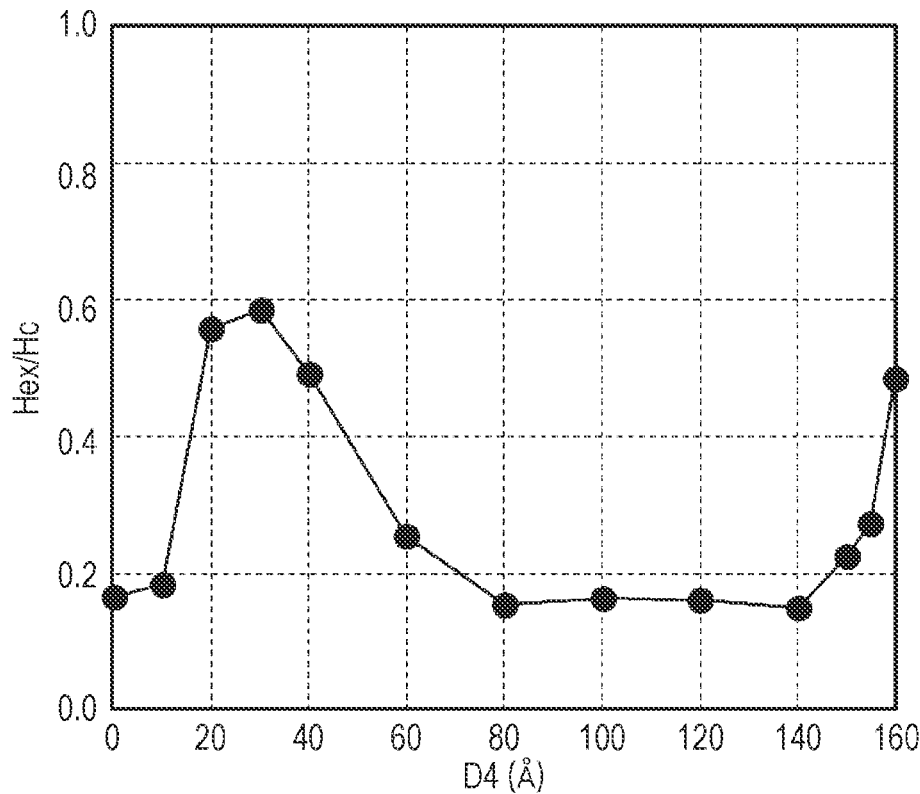
FIG. 25 is a graph illustrating the dependence of the ratio (Hex/Hc) of the exchange coupling field Hex to the coercive force Hc on the thickness of a second PtMn layer.
Figure 26:
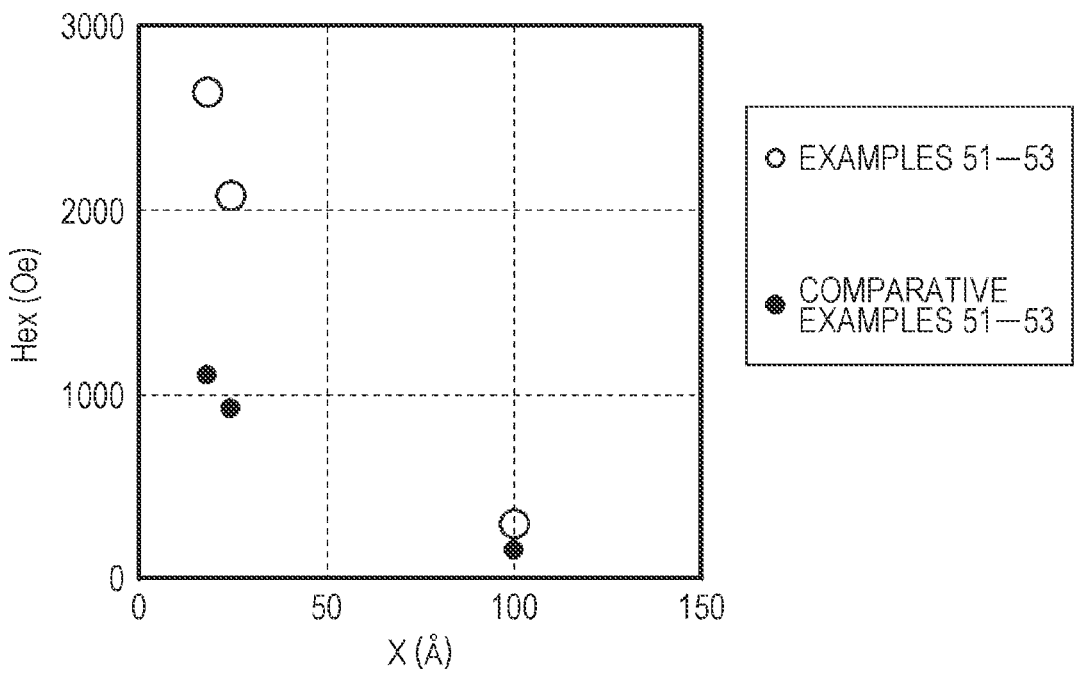
FIG. 26 is a graph illustrating the dependence of the exchange coupling field Hex on the thickness X of a pinned magnetic layer ($Co_{90at\%}Fe_{10at\%}$)
Figure 27:
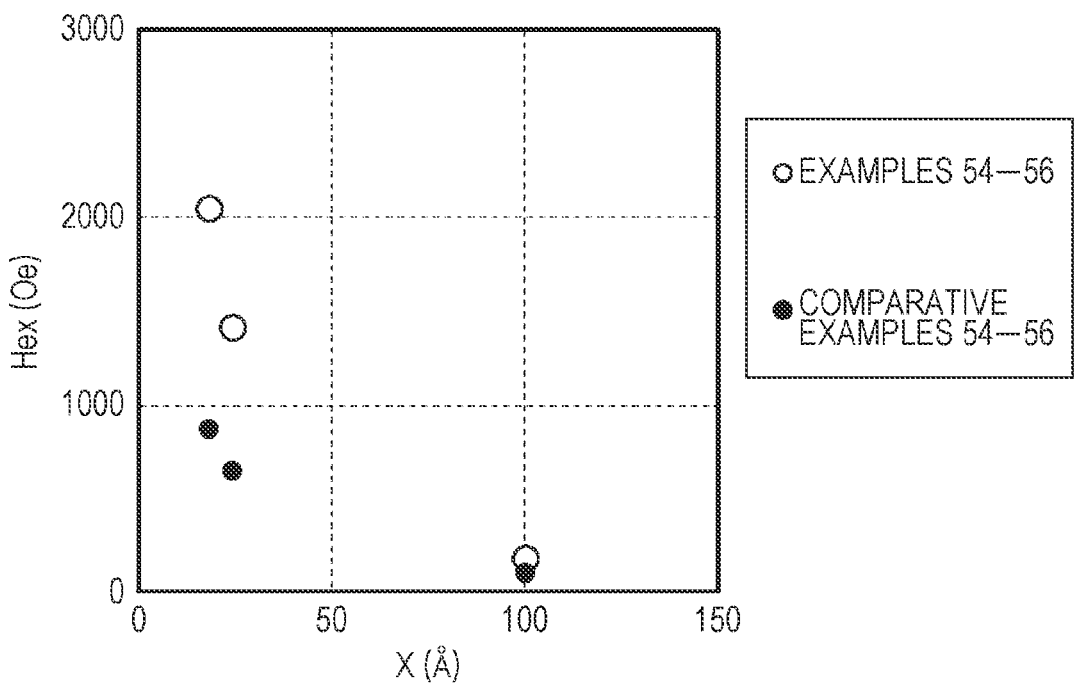
FIG. 27 is a graph illustrating the dependence of the exchange coupling field Hex on the thickness X of the pinned magnetic layer ($Co_{40at\%}Fe_{60at\%}$)
Figure 28:
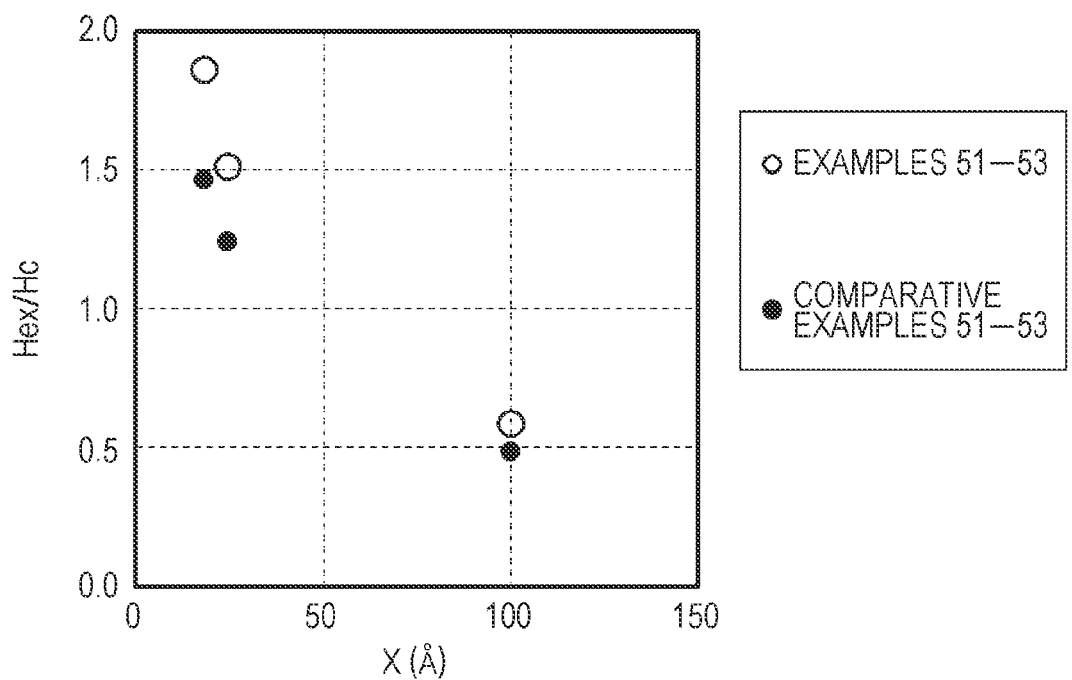
FIG. 28 is a graph illustrating the dependence of the ratio (Hex/Hc) of the exchange coupling field Hex to the coercive force Hc on the thickness X of the pinned magnetic layer ($Co_{90at\%}Fe_{10at\%}$)
Figure 29:
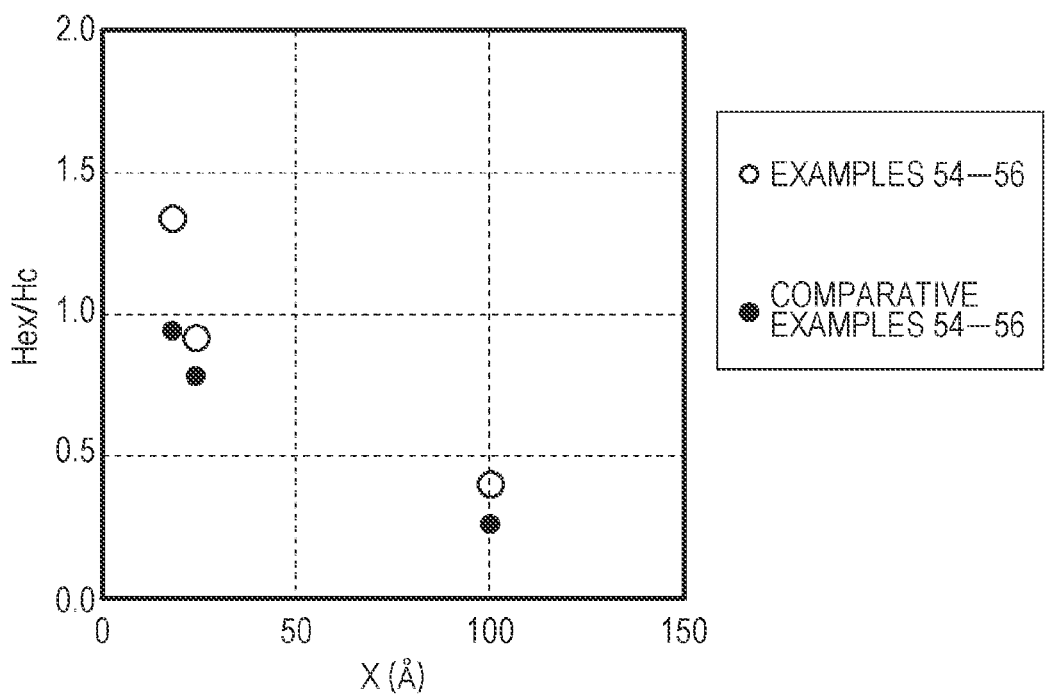
FIG. 29 is a graph illustrating the dependence of the ratio (Hex/Hc) of the exchange coupling field Hex to the coercive force Hc on the thickness X of the pinned magnetic layer ($Co_{40at\%}Fe_{60at\%}$)

As presented in Table 15 and FIGS. 24 and 25, the exchange-coupled films 74 according to Examples 41 to 48 had high exchange coupling fields Hex. Hex/Hc of each of the exchange-coupled films 74 according to Examples 41 to 48 was higher than that in Comparative example 41 (0.10). Additionally, the results indicate that in the case where the second PtMn layer 8d had a thickness D4 of more than 10 Å and less than 60 Å, in the case where the second PtMn layer 8d preferably had a thickness D4 of 15 Å or more and 55 Å or less, or in the case where the second PtMn layer 8d more preferably had a thickness D4 of 20 Å or more and 50 Å or less (Examples 42 to 44), the exchange coupling field Hex and Hex/Hc were markedly increased. Accordingly, the magnetic sensing elements (for example, magnetoresistive elements) including the exchange-coupled films 74 according to Examples 41 to 48 can exhibit excellent magnetic properties even in a strong magnetic field environment. Comparisons between Comparative example 42 and Example 43 indicated that in the structure of Example 43 in which the exchange coupling field Hex and Hex/Hc were markedly high, the exchange coupling field Hex and the coercive force Hc were significantly decreased by changing the first PtMn layer 8b located adjacent to the pinned magnetic layer 3 to the PtCr layer. In other words, it was found that the first PtMn layer 8b having a thickness of 20 Å, which is very small as compared with the antiferromagnetic layer 84 having a total thickness of 180 Å, has a particularly important role in enhancing the exchange coupling field Hex and Hex/Hc.

Examples 51 to 56 and Comparative Examples 51 to 56

Multilayer stacks 221 having a layer structure described below (see FIG. 21) were produced for the purpose of evaluating the characteristics of exchange-coupled films 74. In the following examples and comparative examples, values given in parentheses represent the thickness (Å). Each of the multilayer stacks 221 was subjected to annealing treatment at 350° C. for 20 hours in a magnetic field of 15 kOe to pin the magnetization of the pinned magnetic layer 3 formed of a ferromagnetic layer and an antiferromagnetic layer 84, thereby producing the multilayer stack 221 including the exchange-coupled film 74.

Substrate SB: silicon substrate including alumina layer formed on surface/underlying layer 1: NiFeCr (42)/non-magnetic material layer 4: [Cu (30)/Ru (10)]/pinned magnetic layer 3: $Co_{90at\%}Fe_{10at\%}$ (X) or $Co_{40at\%}Fe_{60at\%}$ (X)/antiferromagnetic layer 84 [first PtMn layer 8b: $Pt_{50at\%}Mn_{50at\%}$ (D2)/PtCr layer 8c: $Pt_{61at\%}Cr_{49at\%}$ (D3)/second PtMn layer 8d: $Pt_{50at\%}Mn_{50at\%}$ (D4)]/protective layer 6: Ta (100)

The thickness D2 of each of the first PtMn layers 8b was 20 Å or 180 Å. The thickness D3 of each of the PtCr layers 8c was 0 Å or 130 Å. The thickness D4 of each of the second PtMn layers 8d was 0 Å or 30 Å. The overall thickness (total thickness) of each of the antiferromagnetic layers 84 was fixed at 180 Å. The composition of each of the pinned magnetic layers 3 was $Co_{90at\%}Fe_{10at\%}$ or $Co_{40at\%}Fe_{60at\%}$ These had different thicknesses (X) ranging from 18 Å to 100 Å. Table 16 presents D2, D3, D4, and X in the examples.

TABLE 16

| | Thickness of antiferromagnetic layer (Å) | | | | Pinned magnetic layer | | | | |
|---|---|---|---|---|---|---|---|---|---|
| | D2 | D3 | D4 | Total thickness | Composition | X (Å) | Hex (Oe) | Hc (Oe) | Hex/Hc |
| Comparative example 51 | 180 | 0 | 0 | 180 | 90CoFe | 18 | 1105 | 755 | 1.46 |
| Comparative example 52 | | | | | | 24 | 930 | 750 | 1.24 |
| Comparative example 53 | | | | | | 100 | 160 | 330 | 0.48 |
| Comparative example 54 | | | | | 60FeCo | 18 | 875 | 925 | 0.95 |
| Comparative example 55 | | | | | | 24 | 660 | 840 | 0.79 |

TABLE 16-continued

| | Thickness of antiferromagnetic layer (Å) | | | | Pinned magnetic layer | | Hex | Hc | |
|---|---|---|---|---|---|---|---|---|---|
| | D2 | D3 | D4 | Total thickness | Composition | X (Å) | (Oe) | (Oe) | Hex/Hc |
| Comparative example 56 | | | | | | 100 | 110 | 420 | 0.26 |
| Example 51 | 20 | 130 | 30 | | 90CoFe | 18 | 2650 | 1420 | 1.87 |
| Example 52 | | | | | | 24 | 2090 | 1380 | 1.51 |
| Example 53 | | | | | | 100 | 305 | 520 | 0.59 |
| Example 54 | | | | | 60FeCo | 18 | 2050 | 1530 | 1.34 |
| Example 55 | | | | | | 24 | 1420 | 1540 | 0.92 |
| Example 56 | | | | | | 100 | 190 | 470 | 0.40 |

Magnetization curves of the exchange-coupled films 74 according to the examples were measured with a vibrating sample magnetometer (VSM). The exchange coupling fields Hex (unit: Oe), the coercive forces Hc (unit: Oe), and the ratios (Hex/Hc) of the exchange coupling fields Hex to the coercive forces Hc were determined from the resulting hysteresis loops. Table 16 and FIGS. 26 to 29 present the results.

As presented in Table 16 and FIGS. 26 to 29, a smaller thickness of the pinned magnetic layer 3 tended to result in a higher exchange coupling field Hex and higher Hex/Hc, regardless of the composition of the pinned magnetic layer 3. Accordingly, magnetic sensing elements (for example, magnetoresistive elements) including the exchange-coupled films 74 according to Examples 51 to 56 can exhibit excellent magnetic properties even in a strong magnetic field environment. In particular, in the case where the thickness of the pinned magnetic layer 3 may be small, a higher exchange coupling field Hex and higher Hex/Hc can be achieved by adjustment of the thickness of the pinned magnetic layer 3.

Examples 61 to 78 and Comparative Examples 61 and 62

Multilayer stacks 22 having a layer structure described below (see FIG. 6) were produced for the purpose of evaluating the characteristics of exchange-coupled films 40. In the following examples and comparative examples, values given in parentheses represent the thickness (Å). Each of the multilayer stacks 22 was subjected to annealing treatment at 350° C. for 20 hours in a magnetic field of 15 kOe to pin the magnetization of the pinned magnetic layer 3 formed of a ferromagnetic layer and the antiferromagnetic layer 2, thereby producing the multilayer stack 22 including the exchange-coupled film 40.

Substrate SB: silicon substrate including alumina layer formed on surface/underlying layer 1: NiFeCr (42)/nonmagnetic material layer 4: [Cu (30)/Ru (10)]/pinned magnetic layer 3: $Co_{90at\%}Fe_{10at\%}$ (100)/antiferromagnetic layer 2 [IrMn layer 2a: $Ir_{20at\%}Mn_{80at\%}$ (8)/first PtMn layer 2b: $Pt_{50at\%}Mn_{50at\%}$ (12)/PtCr layer 2c: $Pt_{51at\%}Cr_{49at\%}$ (d3)/second PtMn layer 2d: $Pt_{50at\%}Mn_{50at\%}$ (d4)]/protective layer 6: Ta (100)

The thickness d3 of each of the PtCr layers 2c was 130 Å or 160 Å. The second PtMn layers 2d had different thicknesses d4 ranging from 0 Å to 80 Å. Table 17 presents d3 and d4 in each of the examples.

TABLE 17

| | Thickness of antiferromagnetic layer (Å) | | | | Total thickness | Hex (Oe) | Hc (Oe) | Hex/Hc |
|---|---|---|---|---|---|---|---|---|
| | d1 | d2 | d3 | d4 | | | | |
| Comparative example 61 | 8 | 12 | 130 | 0 | 150 | 110 | 118 | 0.93 |
| Example 61 | | | | 10 | 160 | 146 | 137 | 1.07 |
| Example 62 | | | | 20 | 170 | 288 | 198 | 1.45 |
| Example 63 | | | | 25 | 175 | 331 | 192 | 1.73 |
| Example 64 | | | | 30 | 180 | 334 | 182 | 1.84 |
| Example 65 | | | | 35 | 185 | 319 | 174 | 1.84 |
| Example 66 | | | | 40 | 190 | 300 | 160 | 1.88 |
| Example 67 | | | | 50 | 200 | 272 | 160 | 1.70 |
| Example 68 | | | | 60 | 210 | 264 | 156 | 1.69 |
| Example 69 | | | | 80 | 230 | 246 | 166 | 1.48 |
| Comparative example 62 | 8 | 12 | 160 | 0 | 180 | 233 | 188 | 1.24 |
| Example 70 | | | | 10 | 190 | 228 | 183 | 1.25 |
| Example 71 | | | | 20 | 195 | 328 | 198 | 1.66 |
| Example 72 | | | | 25 | 200 | 364 | 226 | 1.61 |
| Example 73 | | | | 30 | 205 | 361 | 192 | 1.88 |
| Example 74 | | | | 35 | 210 | 353 | 181 | 1.95 |
| Example 75 | | | | 40 | 220 | 327 | 178 | 1.84 |
| Example 76 | | | | 50 | 230 | 305 | 170 | 1.79 |
| Example 77 | | | | 60 | 240 | 299 | 161 | 1.86 |
| Example 78 | | | | 80 | 260 | 285 | 153 | 1.86 |

Magnetization curves of the exchange-coupled films 40 according to the examples were measured with a vibrating sample magnetometer (VSM). The exchange coupling fields Hex (unit: Oe), the coercive forces Hc (unit: Oe), and the ratios (Hex/Hc) of the exchange coupling fields Hex to the coercive forces Hc were determined from the resulting hysteresis loops. Table 17 and FIGS. 30 to 33 present the results.

Figure 30:
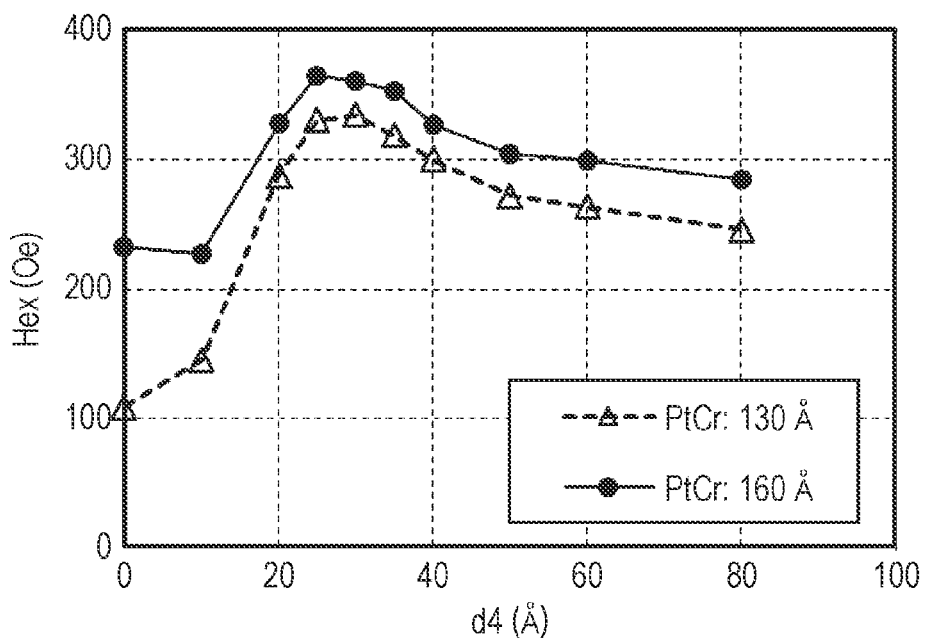
FIG. 30 is a graph illustrating the dependence of the exchange coupling field Hex on the thickness of the second PtMn layer.
Figure 31:
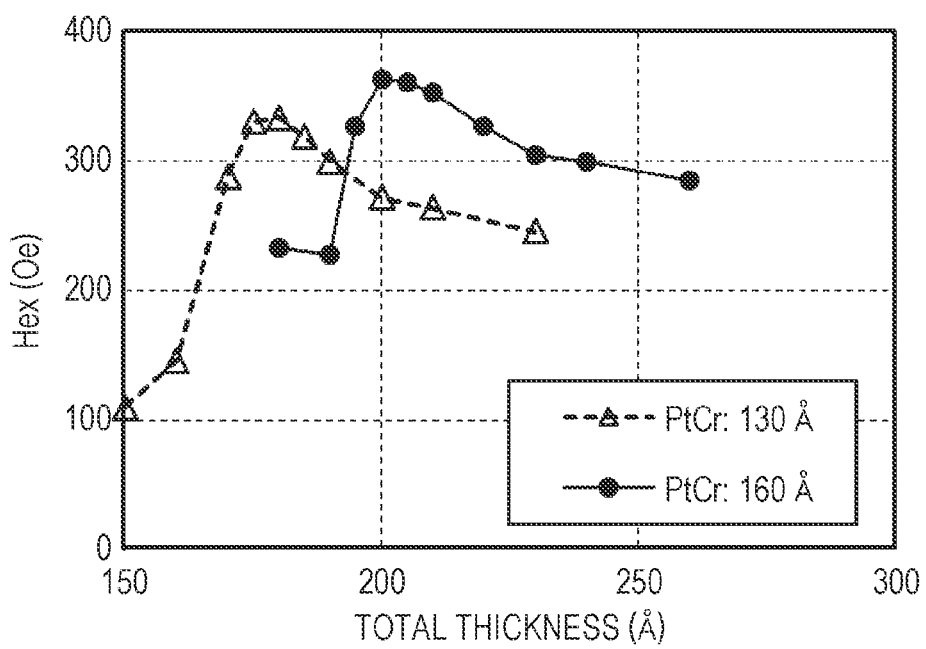
FIG. 31 is a graph illustrating the dependence of the exchange coupling field Hex on the total thickness of the antiferromagnetic layer.
Figure 32:
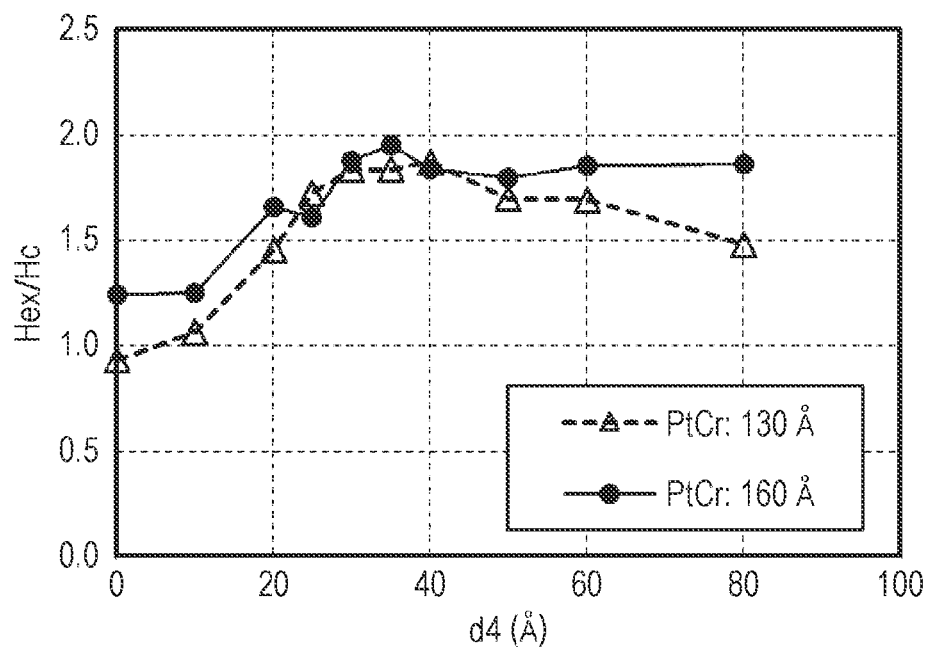
FIG. 32 is a graph illustrating the dependence of the ratio (Hex/Hc) of the exchange coupling field Hex to the coercive force Hc on the thickness of the second PtMn layer.
Figure 33:
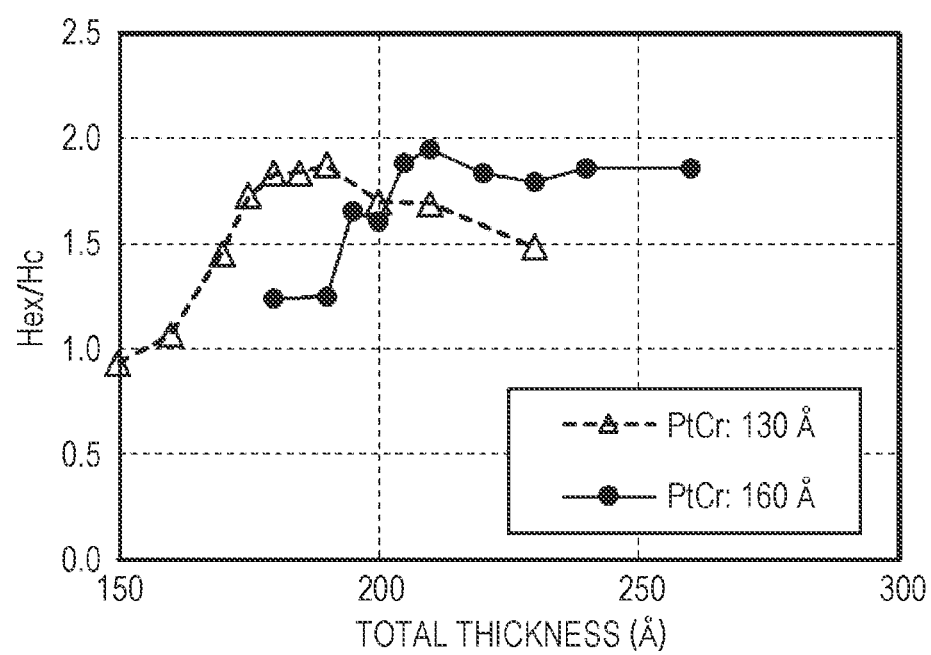
FIG. 33 is a graph illustrating the dependence of the ratio (Hex/Hc) of the exchange coupling field Hex to the coercive force Hc on the total thickness of the antiferromagnetic layer.

As presented in Table 17 and FIGS. 30 and 32, when the second PtMn layer 2d had a thickness of more than 10 Å and less than 60 Å, the exchange coupling field Hex and Hex/Hc tended to be increased, regardless of the thickness d3 of the PtCr layer 2c. Additionally, when the second PtMn layer 2d had a thickness of more than 10 Å and less than 60 Å, the values of the exchange coupling fields Hex and the values of Hex/Hc at a thickness d3 of the PtCr layer 2c of 130 Å were substantially equal to those at a thickness d3 of the PtCr layer 2c of 160 Å. Accordingly, these results indicated that when the second PtMn layer 2d of the exchange-coupled film 40 had a thickness of more than 10 Å and less than 60 Å, variations in the thickness of the PtCr layer 2c less affected the magnetic properties.

Typically, a larger thickness of the antiferromagnetic layer tends to result in a higher exchange coupling field Hex and higher Hex/Hc. However, as presented in Table 17 and FIGS. 31 and 33, in the case where the antiferromagnetic layer 2 of the exchange-coupled film 40 according to each of the examples had a large total thickness, a thickness range in which the exchange coupling field Hex and Hex/Hc were specifically high tended to be observed.

Examples 81 to 105 and Comparative Examples 81 to 83

Multilayer stacks 22 and 221 having layer structures described below (see FIGS. 6 and 21) were produced for the purpose of evaluating the characteristics of exchange-coupled films 40 and 74. In the following examples and comparative examples, values given in parentheses represent the thickness (A). The multilayer stacks 22 and 221 were subjected to annealing treatment at 350° C. for 20 hours in a magnetic field of 15 kOe to pin the magnetization of the pinned magnetic layer 3 formed of a ferromagnetic layer and the antiferromagnetic layer 2, thereby producing the multilayer stacks 22 and 221 including the exchange-coupled films 40 and 74.

Substrate SB: silicon substrate including alumina layer formed on surface/underlying layer 1: NiFeCr (42)/non-magnetic material layer 4: [Cu (30)/Ru (10)]/pinned magnetic layer 3: $Co_{90at\%}Fe_{10at\%}$ (100)/antiferromagnetic layer 2 [IrMn layer 2a: $Ir_{20at\%}Mn_{80at\%}$ (d1)/first PtMn layer 2b: $Pt_{50at\%}Mn_{50at\%}$ (d2)/PtCr layer 2c: $Pt_{51at\%}Cr_{49at\%}$ (130)/second PtMn layer 2d: $Pt_{50at\%}Mn_{50at\%}$ (30)]/protective layer 6: Ta (100)

The IrMn layers 2a had different thicknesses d1 ranging from 0 Å to 20 Å. The first PtMn layers 2b had different thicknesses d2 ranging from 0 Å to 22 Å. Thereby, the exchange-coupled films 40 and 74 having different total thicknesses ranging from 180 Å to 186 Å were obtained. Table 18 presents d1, the thickness d2 of the first PtMn layer 2b, and the total thickness in each of the examples.

TABLE 18

| | Thickness of antiferromagnetic layer (Å) | | | | Hex (Oe) | Hc (Oe) | Hex/Hc |
|---|---|---|---|---|---|---|---|
| | d1 | d2 | d3 | d4 | Total thickness | | | |
| Example 81 | 0 | 20 | 130 | 30 | 180 | 305 | 520 | 0.59 |
| Example 82 | 2 | 18 | | | | 315 | 365 | 0.86 |
| Example 83 | 4 | 16 | | | | 348 | 323 | 1.08 |
| Example 84 | 6 | 14 | | | | 353 | 228 | 1.55 |
| Example 85 | 8 | 12 | | | | 336 | 166 | 2.02 |
| Example 86 | 10 | 10 | | | | 285 | 150 | 1.90 |
| Example 87 | 12 | 8 | | | | 202 | 97 | 2.09 |
| Comparative example 81 | 14 | 6 | | | | 120 | 90 | 1.33 |
| Comparative example 82 | 16 | 4 | | | | 63 | 68 | 0.93 |
| Comparative example 83 | 20 | 0 | | | | 24 | 57 | 0.42 |
| Example 88 | 0 | 22 | | | 182 | 288 | 543 | 0.53 |
| Example 89 | 2 | 20 | | | | 304 | 464 | 0.66 |
| Example 90 | 4 | 18 | | | | 331 | 306 | 1.08 |
| Example 91 | 6 | 16 | | | | 346 | 229 | 1.51 |
| Example 92 | 8 | 14 | | | | 336 | 186 | 1.81 |
| Example 93 | 10 | 12 | | | | 300 | 146 | 2.06 |
| Example 94 | 0 | 24 | | | 184 | 249 | 532 | 0.47 |
| Example 95 | 2 | 22 | | | | 270 | 406 | 0.66 |
| Example 96 | 4 | 20 | | | | 305 | 295 | 1.03 |
| Example 97 | 6 | 18 | | | | 334 | 239 | 1.40 |
| Example 98 | 8 | 16 | | | | 333 | 223 | 1.49 |
| Example 99 | 10 | 14 | | | | 308 | 156 | 1.97 |
| Example 100 | 0 | 26 | | | 186 | 223 | 450 | 0.49 |
| Example 101 | 2 | 24 | | | | 238 | 413 | 0.58 |
| Example 102 | 4 | 22 | | | | 298 | 353 | 0.84 |
| Example 103 | 6 | 20 | | | | 315 | 266 | 1.18 |
| Example 104 | 8 | 18 | | | | 324 | 204 | 1.59 |
| Example 105 | 10 | 16 | | | | 306 | 164 | 1.87 |

Magnetization curves of the exchange-coupled films 40 and 74 according to the examples were measured with a vibrating sample magnetometer (VSM). The exchange coupling fields Hex (unit: Oe), the coercive forces Hc (unit: Oe), and the ratios (Hex/Hc) of the exchange coupling fields Hex to the coercive forces Hc were determined from the resulting hysteresis loops. Table 18 and FIGS. 34 to 36 present the results.

Figure 34:
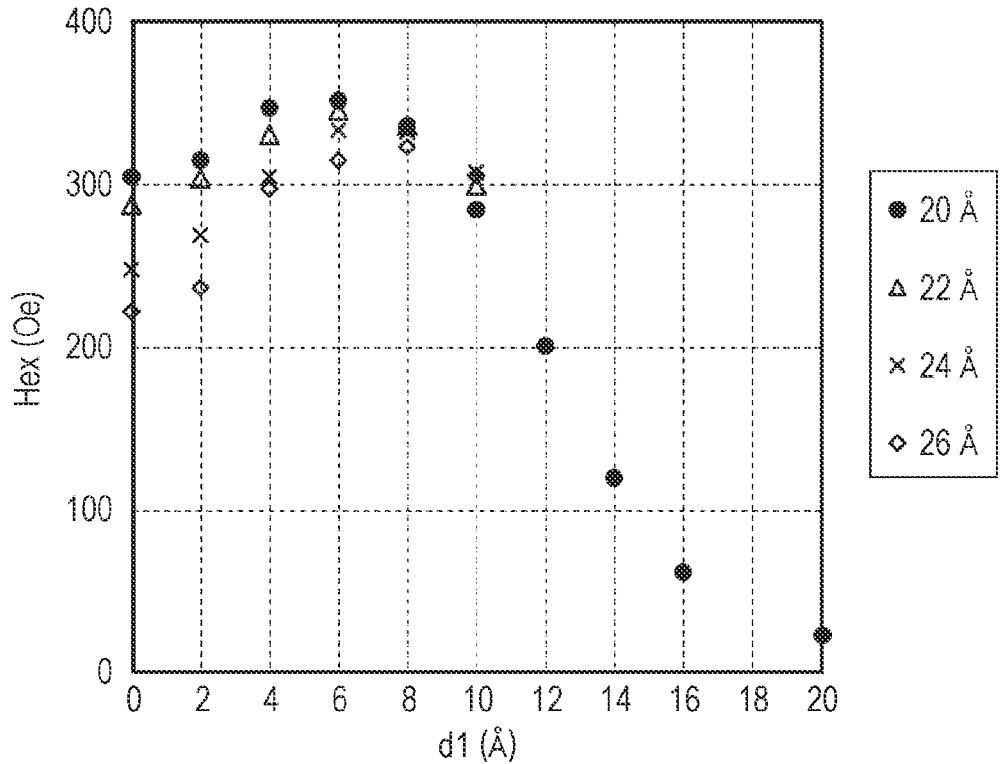
FIG. 34 is a graph illustrating the dependence of the exchange coupling field Hex on the thickness of an IrMn layer.
Figure 35:
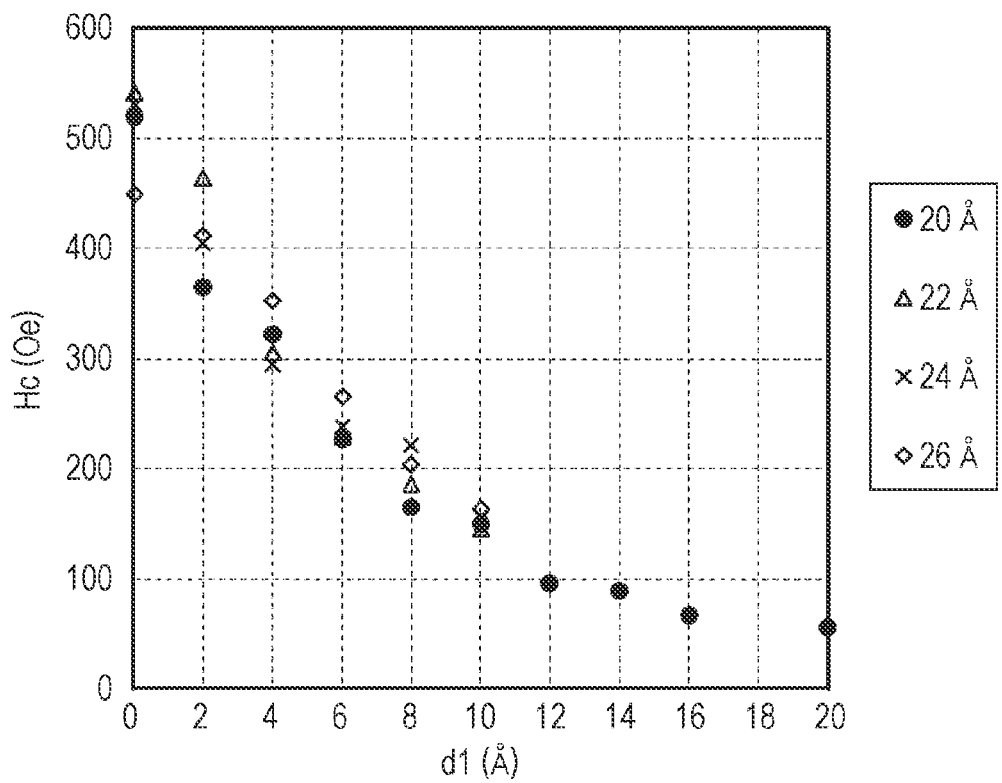
FIG. 35 is a graph illustrating the dependence of the coercive force Hc on the thickness of the IrMn layer.
Figure 36:
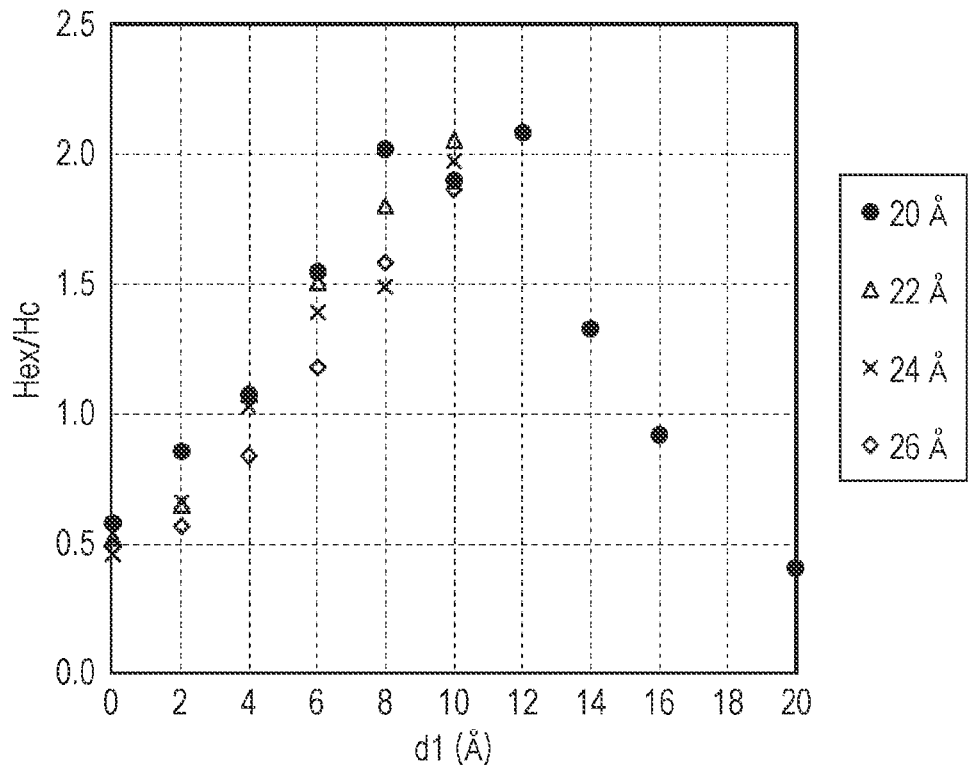
FIG. 36 is a graph illustrating the dependence of the ratio (Hex/Hc) of the exchange coupling field Hex to the coercive force Hc on the thickness of the IrMn layer.

Table 18 and FIGS. 34 to 36 indicated that the exchange coupling field Hex was capable of being maintained at a high level even at a different thickness d2 of the first PtMn layer 2b as long as the thickness d1 of the IrMn layer 2a was in the range of 12 Å or less. In particular, it was found that when the IrMn layer 2a had a thickness of 4 Å or more and 10 Å or less, a high exchange coupling field Hex and high Hex/Hc (specifically, 1.0 or more) were capable of being stably achieved. In other words, the results indicated that when the exchange-coupled film 40 is produced, the relatively loose tolerance of the thickness d2 of the first PtMn layer 2b can be set.

Examples 111 to 128 and Comparative Examples 111 to 131

Multilayer stacks 22 having a layer structure described below (see FIG. 6) were produced for the purpose of evaluating the characteristics of exchange-coupled films 40. In the following examples and comparative examples, values given in parentheses represent the thickness (A). Each of the multilayer stacks 22 was subjected to annealing treatment at 350° C. for 20 hours in a magnetic field of 10 kOe to pin the magnetization of the pinned magnetic layer 3 formed of a ferromagnetic layer and the antiferromagnetic layer 2, thereby producing the multilayer stacks 22 including the exchange-coupled film 40.

Substrate SB: silicon substrate including alumina layer formed on surface/underlying layer 1: NiFeCr (42)/non-magnetic material layer 4: [Cu (30)/Ru (20)]/pinned magnetic layer 3: $Co_{90at\%}Fe^{10at\%}$ (100)/antiferromagnetic layer 2 [IrMn layer 2a: $Ir_{22at\%}Mn_{78at\%}$ (d1)/first PtMn layer 2b: $Pt_{50at\%}Mn_{50at\%}$ (d2)/PtCr layer 2c: $Pt_{51at\%}Cr_{49at\%}$ (d3)/second PtMn layer 2d: $Pt_{50at\%}Mn_{50at\%}$ (d4)]/protective layer 6: Ta (100)

The IrMn layers 2a had different thicknesses d1 ranging from 0 Å to 8 Å. The first PtMn layers 2b had different thicknesses d2 ranging from 0 Å to 300 Å. The PtCr layers 2c had different thicknesses d3 ranging from 0 Å to 300 Å. The second PtMn layers 2d had different thicknesses d4 ranging from 0 Å to 30 Å. Table 19 presents d1 to d4 and the thickness (total thickness) of the entire antiferromagnetic layer 2 in each of the examples and comparative examples.

TABLE 19

| | Thickness of antiferromagnetic layer (Å) | | | | | |
| --- | --- | --- | --- | --- | --- | --- |
| | d1 | d2 | d3 | d4 | Total thickness | Hex (Oe) |
| Comparative example 111 | 0 | 0 | 300 | 0 | 300 | 10 |
| Comparative example 112 | | | 180 | | 180 | 0 |
| Comparative example 113 | | | 120 | | 120 | 0 |
| Comparative example 114 | 0 | 20 | 280 | 0 | 300 | 349 |
| Comparative example 115 | | | 180 | | 200 | 63 |
| Comparative example 116 | | | 160 | | 180 | 25 |
| Comparative example 117 | | | 140 | | 160 | 0 |
| Comparative example 118 | | | 120 | | 140 | 0 |
| Comparative example 119 | | | 100 | | 120 | 0 |
| Comparative example 120 | 4 | 16 | 280 | 0 | 300 | 368 |
| Comparative example 121 | | | 180 | | 200 | 173 |
| Comparative example 122 | | | 160 | | 180 | 98 |
| Comparative example 123 | | | 140 | | 160 | 48 |
| Comparative example 124 | | | 120 | | 140 | 16 |
| Comparative example 125 | | | 100 | | 120 | 3 |
| Comparative example 126 | 0 | 300 | 0 | 0 | 300 | 275 |
| Comparative example 127 | | 200 | | | 200 | 210 |
| Comparative example 128 | | 180 | | | 180 | 170 |
| Comparative example 129 | | 160 | | | 160 | 135 |
| Comparative example 130 | | 140 | | | 140 | 100 |
| Comparative example 131 | | 120 | | | 120 | 35 |
| Example 111 | 0 | 20 | 250 | 30 | 300 | 520 |
| Example 112 | | | 150 | | 200 | 365 |
| Example 113 | | | 130 | | 180 | 285 |
| Example 114 | | | 110 | | 160 | 190 |
| Example 115 | | | 90 | | 140 | 93 |
| Example 116 | | | 70 | | 120 | 10 |
| Example 117 | 4 | 16 | 250 | 30 | 300 | 445 |
| Example 118 | | | 150 | | 200 | 384 |
| Example 119 | | | 130 | | 180 | 352 |
| Example 120 | | | 110 | | 160 | 310 |
| Example 121 | | | 90 | | 140 | 239 |
| Example 122 | | | 70 | | 120 | 150 |
| Example 123 | 8 | 12 | 250 | 30 | 300 | 362 |
| Example 124 | | | 150 | | 200 | 346 |
| Example 125 | | | 130 | | 180 | 338 |
| Example 126 | | | 110 | | 160 | 313 |
| Example 127 | | | 90 | | 140 | 275 |
| Example 128 | | | 70 | | 120 | 220 |

Magnetization curves of the exchange-coupled films 40 according to the examples and the comparative examples were measured with a vibrating sample magnetometer (VSM). The exchange coupling fields Hex (unit: Oe) were determined from the resulting hysteresis loops. Table 19 and FIG. 37 present the results.

Figure 37:
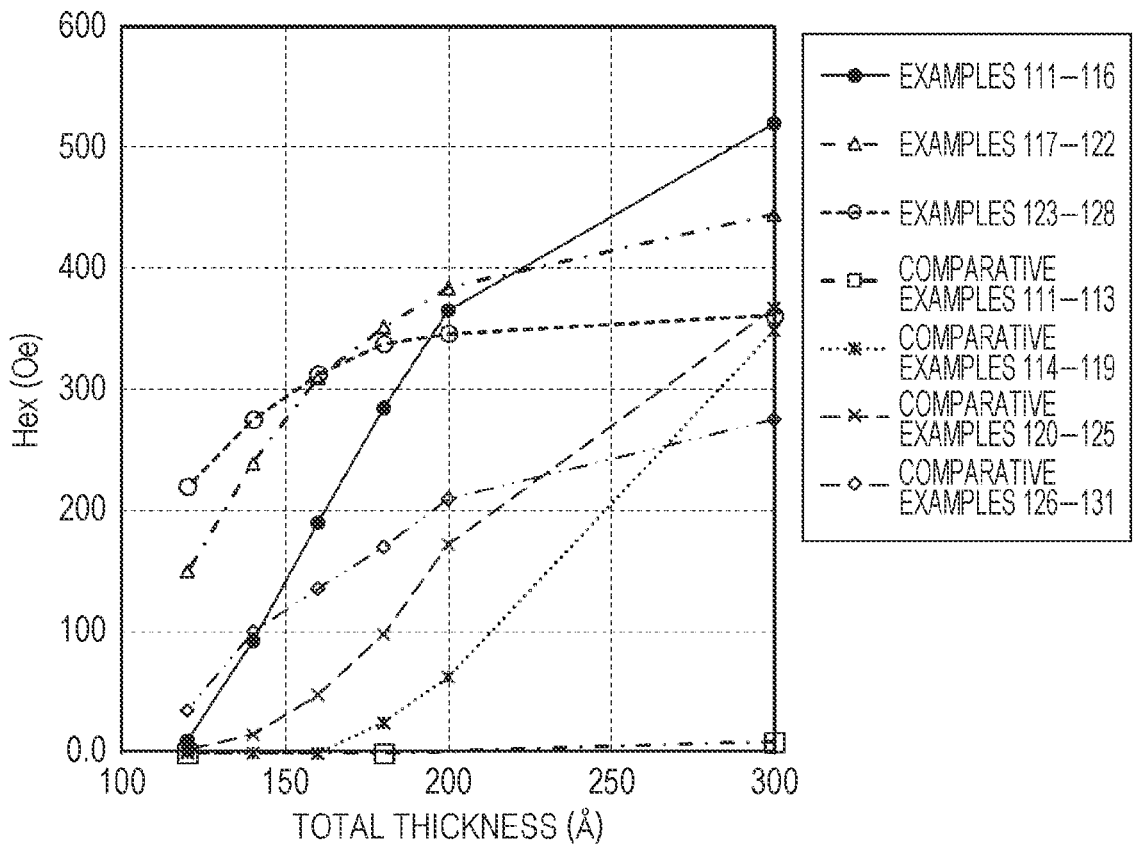
FIG. 37 is a graph illustrating the dependence of the exchange coupling field Hex on the total thickness of the antiferromagnetic layer.

As illustrated in the results of Examples 111 to 116 in FIG. 37 (black filled circles and a solid line), in the case where the IrMn layer 2a serving as a Mn-containing layer was not provided, as is the case with the exchange-coupled film 74, a larger thickness of the antiferromagnetic layer 2 resulted in a higher exchange coupling field Hex, and the exchange coupling field Hex was 500 Oe or more at a total thickness of the antiferromagnetic layer 2 of 300 Å. Accordingly, when strong-magnetic field resistance is particularly required, the exchange-coupled film 40 having a structure that does not have a Mn-containing layer may be preferred. Meanwhile, as illustrated in the results of Examples 123 to 128 in FIG. 37 (open circles, broken line), in the case where the IrMn layer 2a was provided, as is the case with the exchange-coupled film 40, the strength of the exchange coupling field Hex was relatively less affected by the total thickness of the antiferromagnetic layer 2. In particular, the results indicated that when the total thickness of the antiferromagnetic layer 2 was in the range of 150 Å to 300 Å, the strength of the exchange coupling field Hex was stably in the range of 300 Oe to 350 Oe; thus, the exchange-coupled film 40 having this structure was less affected by variations in film formation during the production process.

What is claimed is:

1. An exchange-coupled film, comprising:
   an antiferromagnetic layer and a ferromagnetic layer stacked together,
   the antiferromagnetic layer having a structure including an IrMn layer, a first PtMn layer, a PtCr layer, and a second PtMn layer stacked in that order, the IrMn layer being adjacent to the ferromagnetic layer.

2. The exchange-coupled film according to claim 1, wherein the structure further includes a PtMn layer stacked between the IrMn layer and the ferromagnetic layer.

3. An exchange-coupled film, comprising:
   an antiferromagnetic layer and a ferromagnetic layer stacked together,
   the antiferromagnetic layer having a structure including a first PtMn layer, a PtCr layer, and a second PtMn layer stacked in that order, the first PtMn layer being adjacent to the ferromagnetic layer, a thickness of the PtCr layer being larger than any of a thickness of the first PtMn layer and a thickness of the second PtMn layer.

4. The exchange-coupled film according to claim 3, wherein the antiferromagnetic layer includes a Mn-containing layer having a Mn content of more than 50 at % between the first PtMn layer and the ferromagnetic layer.

5. The exchange-coupled film according to claim 4, wherein the Mn-containing layer includes multiple layers stacked.

6. The exchange-coupled film according to claim 4, wherein the Mn-containing layer includes at least one layer selected from the group consisting of an IrMn layer and a Mn layer.

7. The exchange-coupled film according to claim 4, wherein the Mn-containing layer has a thickness of 12 Å or less.

8. The exchange-coupled film according to claim 1, wherein the second PtMn layer has a thickness of more than 0 Å and less than 60 Å.

9. The exchange-coupled film according to claim 1, wherein the second PtMn layer has a thickness of 15 Å or more and 55 Å or less.

10. The exchange-coupled film according to claim 1, wherein the PtCr layer has a thickness of 100 Å or more.

11. The exchange-coupled film according to claim 1, wherein the antiferromagnetic layer has a total thickness of 200 Å or less.

12. A magnetoresistive element, comprising:
    an exchange-coupled film, comprising:
    an antiferromagnetic layer and a ferromagnetic layer stacked together, the antiferromagnetic layer having a structure including an IrMn layer, a first PtMn layer, a PtCr layer, and a second PtMn layer stacked in that order, the IrMn layer being close to the ferromagnetic layer; and a free magnetic layer stacked together, the ferromagnetic layer of the exchange-coupled film being included in at least part of a pinned magnetic layer.

13. A magnetic sensor, comprising:
a magnetoresistive element, comprising:
an exchange-coupled film, comprising:
an antiferromagnetic layer and a ferromagnetic layer stacked together, the antiferromagnetic layer having a structure including an IrMn layer, a first PtMn layer, a PtCr layer, and a second PtMn layer stacked in that order, the IrMn layer being close to the ferromagnetic layer; and
a free magnetic layer stacked together, the ferromagnetic layer of the exchange-coupled film being included in at least part of a pinned magnetic layer; and
a power supply that supplies a power supply voltage to the magnetoresistive element.

14. The magnetic sensor according to claim 13, wherein the magnetoresistive element is one of a plurality of magnetoresistive elements disposed on a same substrate, and
the plurality of magnetoresistive elements include the pinned magnetic layers having different pinned magnetization directions.

* * * * *